(12) United States Patent
Watanabe et al.

(10) Patent No.: US 7,982,266 B2
(45) Date of Patent: Jul. 19, 2011

(54) DIELECTRIC MATERIAL SEPARATED-TYPE, HIGH BREAKDOWN VOLTAGE SEMICONDUCTOR CIRCUIT DEVICE, AND PRODUCTION METHOD THEREOF

(75) Inventors: Atsuo Watanabe, Hitachiota (JP); Mitsutoshi Honda, Hitachi (JP); Norio Ishitsuka, Kasumigaura (JP); Masahiro Ito, Hitachi (JP); Toshihito Tabata, Hitachinaka (JP); Shinichi Kurita, Mito (JP); Hidekazu Kamioka, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 975 days.

(21) Appl. No.: 11/684,032

(22) Filed: Mar. 9, 2007

(65) Prior Publication Data

US 2007/0210408 A1 Sep. 13, 2007

(30) Foreign Application Priority Data

Mar. 10, 2006 (JP) .................................. 2006-065023
Sep. 8, 2006 (JP) .................................. 2006-244368

(51) Int. Cl.
*H01L 27/12* (2006.01)
(52) U.S. Cl. ............... 257/347; 257/510; 257/E27.112
(58) Field of Classification Search ................... 438/620,
438/259; 257/510, 342, 343, 348, 349, 339,
257/168, 517, 518, 520, E21.585, E21.564,
257/E27.11, E27.109, E27.056, E27.053,
257/E29.261, E29.197, E29.171, E29.229,
257/487, 488, 526, E29.202, 513–515, 374,
257/347, 350, E27.112
See application file for complete search history.

(56) References Cited

U.S. PATENT DOCUMENTS

| 5,576,241 | A | | 11/1996 | Sakai | |
|---|---|---|---|---|---|
| 5,607,875 | A | | 3/1997 | Nishizawa et al. | |
| 5,644,157 | A | * | 7/1997 | Iida et al. | 257/510 |
| 5,856,700 | A | * | 1/1999 | Woodbury | 257/518 |
| 6,225,664 | B1 | * | 5/2001 | Endo et al. | 257/347 |
| 2002/0020874 | A1 | | 2/2002 | Gimonet | |
| 2002/0043699 | A1 | | 4/2002 | Akiyama | |

(Continued)

FOREIGN PATENT DOCUMENTS

EP 1 202 352 A2 1/1992

(Continued)

OTHER PUBLICATIONS

Search Report in EP 07004591.9-1235/1863081, dated Jun. 10, 2010; (9 pages).

*Primary Examiner* — Matthew C Landau
*Assistant Examiner* — Latanya Crawford
(74) *Attorney, Agent, or Firm* — Antonelli, Terry, Stout & Kraus, LLP.

(57) ABSTRACT

A dielectrically isolated semiconductor device of high reliability is provided by realizing a fine and deep element isolating region which can prevent dislocation of an oxide film as an insulation layer by oxidation-induced stress. The dielectrically isolated semiconductor device includes an SOI substrate supporting an active element layer deeper than an expanded distance of a depletion layer subjected to the highest voltage applied to the device, and an element isolating region which encloses the active element layer. The element isolating region contains a deep trench which comes into contact with the insulation layer, and which is filled with n heavily doped layers on both side walls, second insulation films each adjacent to the n heavily doped layer and a polycrystalline semiconductor layer formed between the second insulation films.

9 Claims, 22 Drawing Sheets

U.S. PATENT DOCUMENTS

| | | | |
|---|---|---|---|
| 2003/0057485 A1* | 3/2003 | Gardes | 257/330 |
| 2004/0026746 A1* | 2/2004 | Nakazawa et al. | 257/374 |
| 2004/0056284 A1* | 3/2004 | Nagaoka et al. | 257/253 |
| 2004/0119091 A1* | 6/2004 | Suzuki et al. | 257/197 |
| 2005/0056906 A1* | 3/2005 | Jimbo et al. | 257/492 |
| 2005/0282375 A1* | 12/2005 | Nitta et al. | 438/620 |
| 2008/0211020 A1* | 9/2008 | Saito | 257/342 |
| 2008/0296679 A1* | 12/2008 | Blanchard | 257/342 |

FOREIGN PATENT DOCUMENTS

| | | |
|---|---|---|
| EP | 1 202 352 A3 | 1/1992 |
| EP | 0628996 A1 | 12/1993 |
| EP | 1 220 312 | 7/2002 |
| EP | 1 331 662 A2 | 7/2003 |
| EP | 1 331 662 A3 | 7/2003 |
| JP | 05-136436 | 6/1993 |
| JP | 05-259266 | 10/1993 |

* cited by examiner

FIG.5
(a)
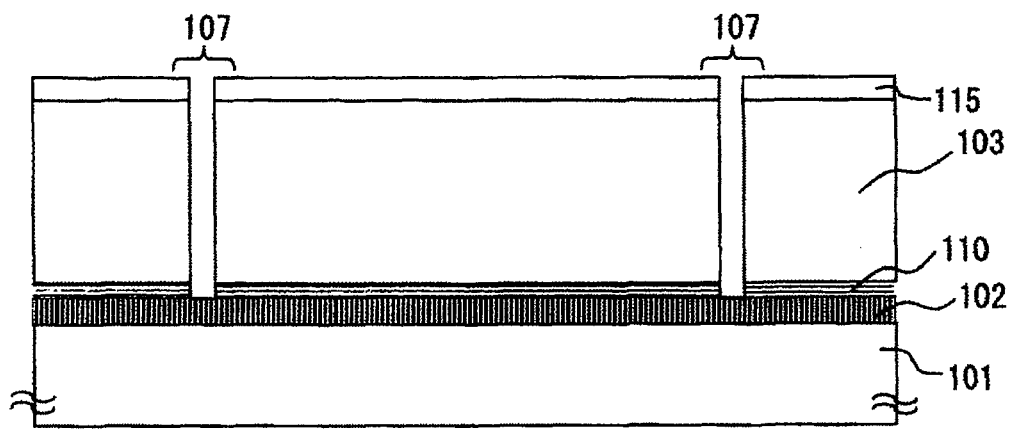
(b)
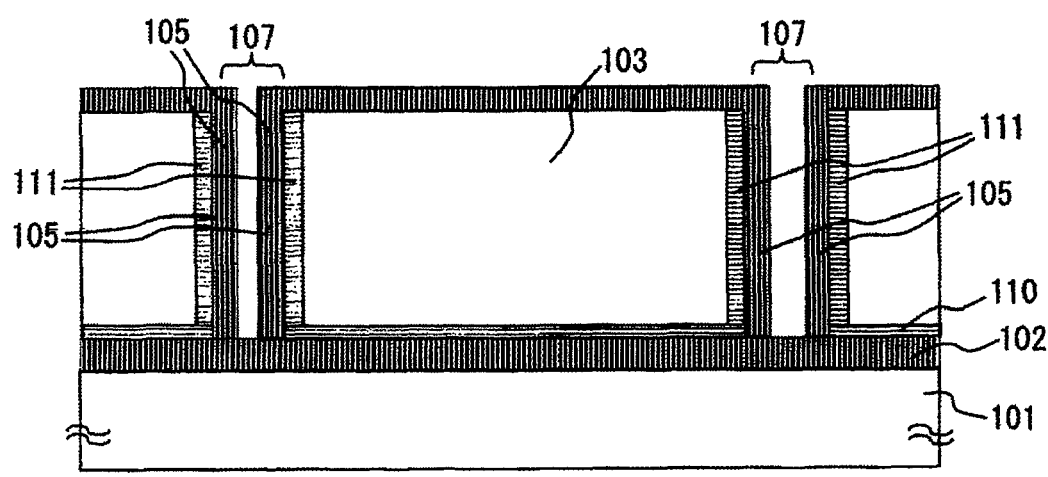
(c)
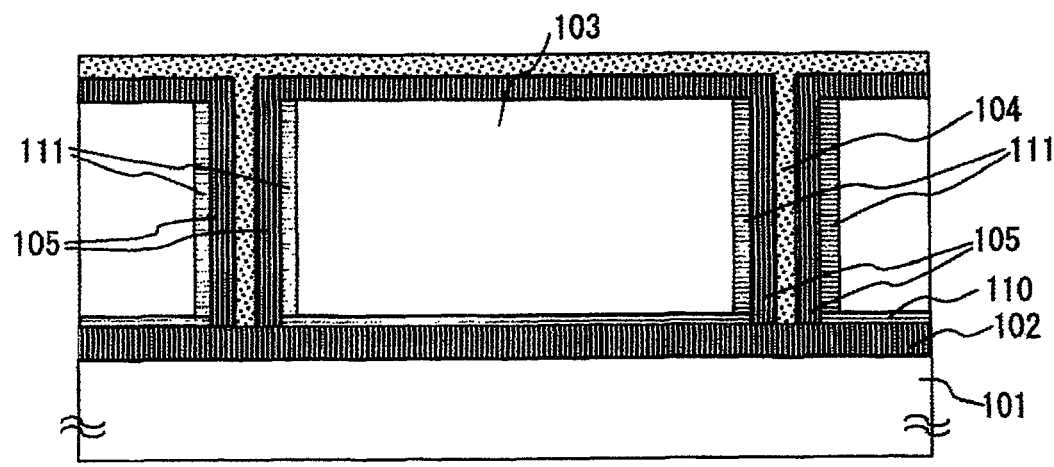

(g)

(SURFACE OXIDE FILM THICKNESS +
CVD-PREPARED OXIDE FILM THICKNESS) /
EMBEDDED OXIDE FILM THICKNESS

FIG.18
(f3)
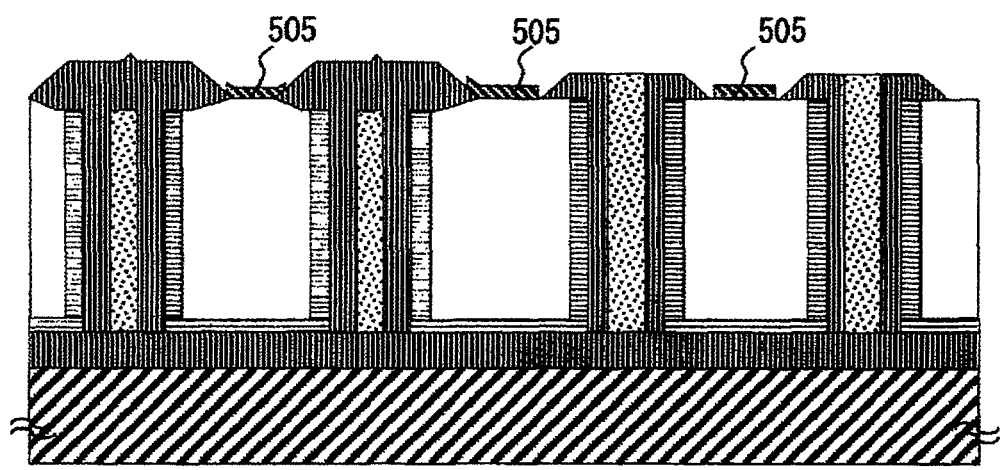
(f4)
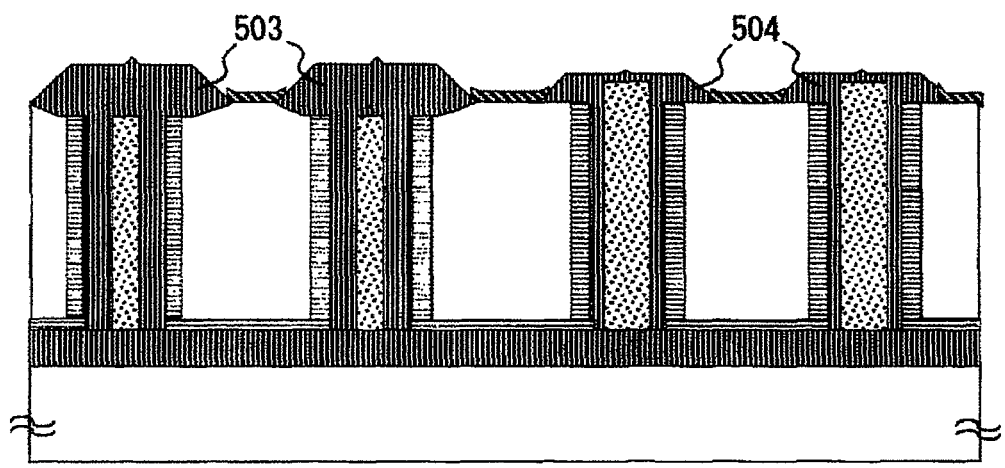
(f5)
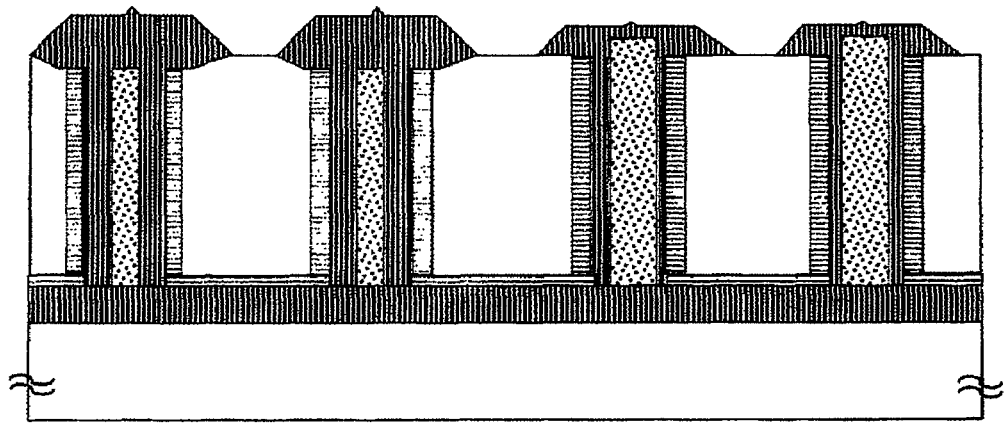

FIG.23
(a)
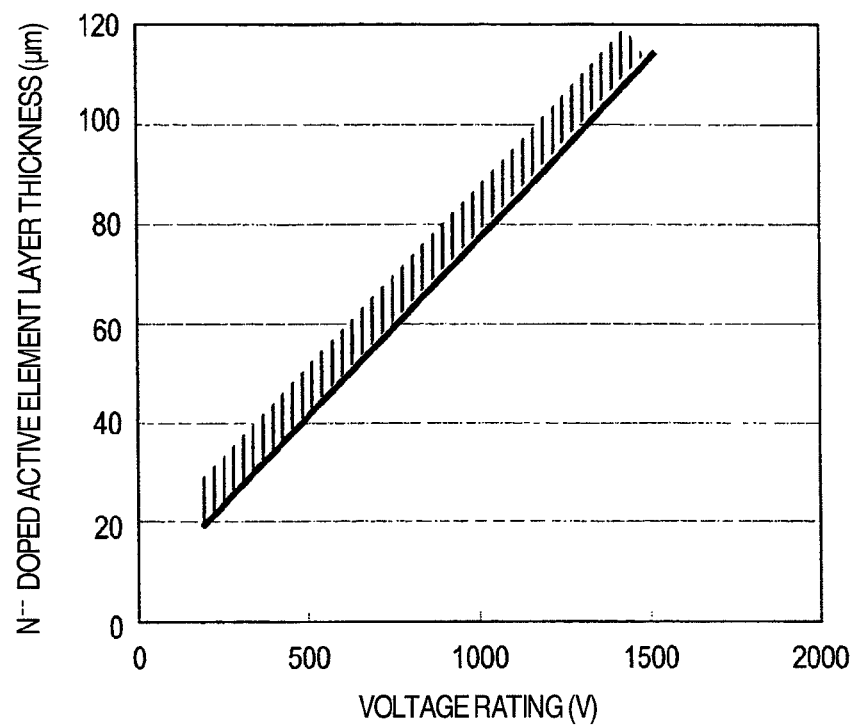
(b)
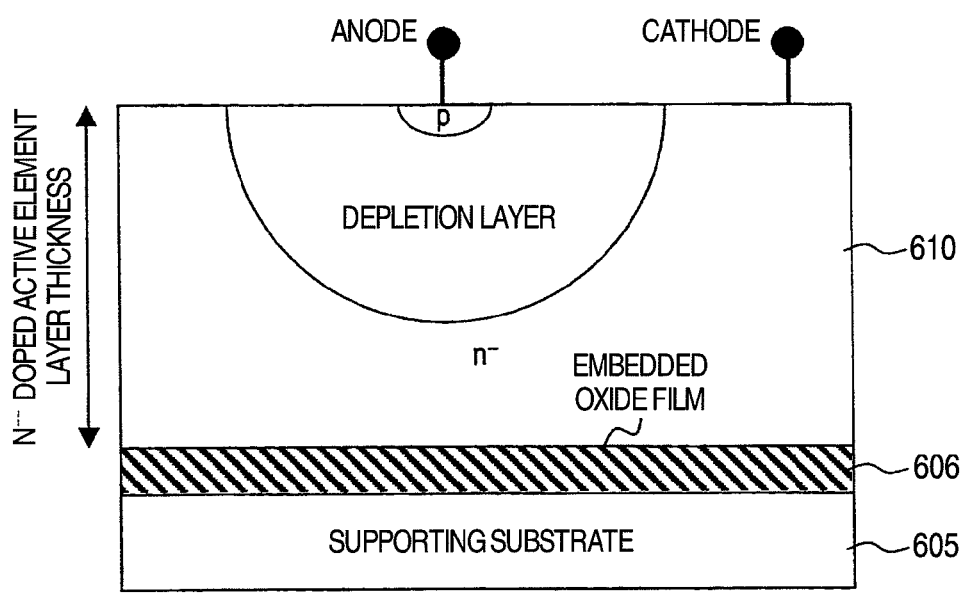

US 7,982,266 B2

DIELECTRIC MATERIAL SEPARATED-TYPE, HIGH BREAKDOWN VOLTAGE SEMICONDUCTOR CIRCUIT DEVICE, AND PRODUCTION METHOD THEREOF

FIELD OF THE INVENTION

The present invention relates to a semiconductor integrated circuit device with elements (devices) isolated by a trench on SOI (a Silicon On Insulator or Semiconductor On Insulator) substrate, in particular a device for intelligent power devices. It also relates to a semiconductor device which uses dielectric isolation for insulation between elements, and process for fabrication thereof.

BACKGROUND OF THE INVENTION

Semiconductor integrated circuit devices with elements, e.g., transistors and resists, on an SOI substrate having a semiconductor layer on an insulation film have various advantages, e.g., reduced parasitic capacitance to realize high-speed switching actions of the order of µs or less, high breakdown voltage of 100 V or more and high reliability resulting from prevented latchup or the like. Patent Document 1 describes an SOI substrate, and also trench type element-isolated structure in detail.

FIG. 2 illustrates a trench type element-isolated structure, wherein 1: silicon-supporting substrate, 2: embedded oxide film, 3: element region, 4: embedded polycrystalline silicon film, 5 and 6: each side oxide film, 7: trench and 8: embedded n+ region. As illustrated, the trench 7 isolates the element regions from each other, and the embedded polycrystalline silicon film 4 is placed between the side oxide films 5.

One of a motor-controlling semiconductor devices proposed (e.g., by Patent Document 2) encloses each element by a dielectric material, e.g., silicon oxide film, to insulate between the elements and between the element and substrate at a high voltage to realize a dielectrically isolated semiconductor device with integrated high breakdown voltage elements, large current outputting circuits, and medium and low breakdown voltage logic circuits.

FIG. 19 illustrates a motor driving system which includes a dielectrically isolated semiconductor device having a one-chip inverter, where the semiconductor device integrated on the same wafer is enclosed by the thick frame. The semiconductor device comprises a driving circuit having an IGBT for driving a motor as a load and upper and lower MOS transistors as the basic components; circuit for generating PWM controlling signals; circuit for distributing the signals to each phase, and so forth. It also comprises, although not shown, a control logic circuit working as an interface with a digital control IC which controls the system as a whole, and various protective circuits.

FIG. 20 is a cross-sectional view illustrating a high breakdown voltage IGBT which is disclosed by Patent Document 2 and can be incorporated in the system shown in FIG. 19. FIG. 20 (a) shows a lightly doped region 610 (?) in which IGBT functional regions are formed, such as an n+ heavily doped emitter region (601), gate electrode (602), p+ heavily doped collector region (603), n doped region (630) which encloses the collector region 603, and 620: p doped region (620) in which a channel is formed. Other regions are silicon-supporting substrate (605), first oxide film (606), second oxide film (705), polycrystalline silicon (704) and n+ heavily doped region (740). The oxide films 606 and 705 dielectrically isolate the n$^{--}$ lightly doped semiconductor region in which the IGBT is formed. FIG. 20 (b) illustrates a state in which a voltage is applied to between the IGBT collector and emitter to block them from each other.

Patent Document 1: JP-A-5-259266 (FIG. 2 (e) and FIG. 6 (d))

Patent Document 2: JP-A-5-136436

BRIEF SUMMARY OF THE INVENTION

Patent Document 1 is essentially silent on an oxide film formed on a substrate after the trench 7 is formed. Depending on shape of an oxide film on a substrate, voltage applied to an oxide film in the trench may vary by potential at a polysilicon interconnection on the trench. In actuality, voltage may not be uniformly applied to the side oxide films 5 and 6 formed in the trench at both sides, when a potential is applied to a polycrystalline silicon interconnection on the surface oxide film and to an electrode on an element region.

These problems are described more specifically. Assuming that each of the oxide films 5 and 6 formed in the trench at both sides has a breakdown voltage of 300 V, the totaled oxide film breakdown voltage will be 600 V, provided that they are uniformly subjected to voltage. However, when the side oxide film 5 is subjected to a 10% higher voltage than the side oxide film 6, dielectric breakdown will occur at a voltage of 270 V applied to the film 6.

Moreover, referring to FIG. 20, the conventional structure disclosed by Patent Document 2 has the lightly doped region 610 too thin to form a neutral region therein, allowing a carrier-deficient region (i.e., depletion region) to expand in the region 610, with the result that the emitter region 610, gate oxide film capacitance and collector region 603 are capacitively coupled to the supporting substrate 605 via the depletion layer capacitance. In other words, in the conventional IGBT illustrated in FIG. 20, noise voltage evolving at the supporting substrate 605 propagates as displacement current (shown by arrows in FIG. 20 (b)) to the gate via capacitance Cox evolving in the first oxide film 606, element depletion layer capacitance and gate capacitance, to increase potential at the gate terminal. When voltage at the terminal exceeds a given level (threshold level), a blocked condition is no longer maintained to switch an off state to an on state, passing an electric current at a low resistance to cause malfunction of the semiconductor device. It is necessary to have an element structure free of capacitive coupling, in order to avoid the malfunction. In other words, it can be avoided by sufficiently increasing lightly doped region 610 thickness to prevent the expanded depletion layer from coming into contact with the oxide film 606, and thereby to leave an electrically neutral region in the region 610.

At the same time, it is also necessary to form a narrow and deep isolation trench for dielectrically separating the semiconductor device from lateral regions. Such a trench is an indispensable prerequisite for narrowing laterally extending element-isolated regions to reduce chip area. At the same time, element isolation needs an oxide film which may be produced by chemical vapor deposition (CVD) or thermal oxidation.

However, it is very difficult to form a uniform oxide film by CVD in a deep trench. On the other hand, thermal oxidation, although giving a uniform oxide film, creates a high compressive stress on the silicon side as a result of volumetric expansion occurring while the oxide film is formed. The oxidation-induced stress causes dislocation in the lightly doped region 610 (line defect in the region) and serious associated troubles, e.g., impurities tending to accumulate in the dislocated sites to create leakage current. The semiconductor device cannot exhibits intended functions, unless these problems are solved.

It is an object of the present invention to provide an integrated circuit device structured to uniformly apply a voltage to side oxide films formed in a trench at both sides.

It is another object of the present invention to provide a dielectrically isolated semiconductor device of high reliability by realizing a fine and deep element isolating region which can prevent dislocation of an oxide film as an insulation layer by oxidation-induced stress. It is still another object to provide a process for fabrication of the above device.

The semiconductor integrated circuit device of the present invention comprises a substrate having a first insulation film under an active device region, silicon trench formed in the element region to come into contact with the first insulation film, second insulation films formed on the trench sides, and third insulation film formed on polycrystalline silicon embedded in the trench, wherein the thickness ratio of the third insulation film to the first insulation film is set in a specific range to uniformly apply a voltage to oxide insulation films provided in the trench at both sides.

The dielectrically isolated semiconductor device of the present invention comprises a substrate supporting single-crystalline silicon via an oxide film (the substrate of this structure being hereinafter referred to as SOI substrate), wherein an active element layer is thicker than a depletion layer formed and extended by the highest voltage applied to the device, and is enclosed by an element isolating region. The element isolating region contains a deep trench which comes into contact with the SOI substrate, and is filled with n heavily doped layers on both side walls, second insulation films each adjacent to the n heavily doped layer and polycrystalline semiconductor layer formed between the silicon insulation films.

The present invention may have an active device region provided on a substrate of SOI structure, and enclosed by an element isolating region forming a closed loop, composed of n-multiple polycrystalline silicon layers, 2n-multiple oxide layers and (n+1)-multiple n$^+$ heavily doped layers.

In other words, the dielectrically isolated semiconductor device of the present invention comprises: a semiconductor substrate; a first insulation film formed on one side of the semiconductor substrate; and a lightly doped semiconductor layer formed on the first insulation film, wherein the lightly doped semiconductor layer is deeper than an expanded distance of the depletion layer subjected to the highest voltage applied to the device to leave a neutral region therein. The lightly doped semiconductor layer has a region in which an element is formed (active device region) and element isolating region which encloses the active device region. The element isolating region is provided with a deep trench coming into contact with the first insulation film and structured to form a two-dimensional closed loop. The trench is filled with n heavily doped layers on both side walls, second insulation films each adjacent to the n heavily doped layer and polycrystalline semiconductor layer between the silicon insulation films.

The element isolating layer has an n-multiple structure, and each active device layer comprises polycrystalline semiconductor layers, second insulation layers adjacent to each side of the polycrystalline semiconductor layer, and n$^+$ heavily doped layers adjacent to each side of the second insulation layer. These adjacent layers are the n-multiple polycrystalline silicon layers, 2n-multiple oxide layers and (n+1)-multiple n$^+$ heavily doped layers, to provide a dielectrically isolated structure.

A heavily doped layer may be formed between the first insulation film and lightly doped semiconductor layer.

The dielectrically isolated semiconductor device may be applied to prediriver ICs and one-chip inverters.

The process of the present invention for fabrication of the dielectrically isolated device comprises steps for preparing an SOI substrate with a first silicon oxide film and silicon layer supported by a silicon-supporting substrate; for forming a trench running almost vertically from the principal surface of the silicon layer to the silicon oxide layer; for heavily doping the trench sides with an n-type impurity element; for filling the trench with an oxide film and polycrystalline silicon, the former being formed by thermal oxidation; and for forming oxide films to isolate active element layers from each other, these oxide films being formed by selective field oxidation to have different thickness. The silicon layer is deeper than an expanded distance of the depletion layer subjected to the highest voltage applied to the device to leave a neutral region therein.

The above process may form a plurality of trenches in the trench forming step, heavily dope each of the trenches with n-type impurity element on the sides in the doping step, and filling each of the trenches with an oxide film prepared by thermal oxidation and polycrystalline silicon in the filling step.

Moreover, the process may also form an SOI substrate with an n doped layer between the first silicon oxide film and silicon layer in the substrate forming step.

The characteristic features of the present invention can be clarified by the preferred embodiments described below and attached drawings.

Other objects, features and advantages of the invention will become apparent from the following description of the embodiments of the invention taken in conjunction with the accompanying drawings.

BRIEF DESCRIPTION OF THE DRAWINGS

FIG. 5 illustrates the process steps for fabrication of the semiconductor integrated circuit device prepared in Example 1.

FIG. 18 illustrates the process for fabrication of the semiconductor integrated circuit device prepared in Example 6.

FIG. 23 presents the relation between $n^{--}$ doped active element layer thickness and element voltage rating.

Figure 1:
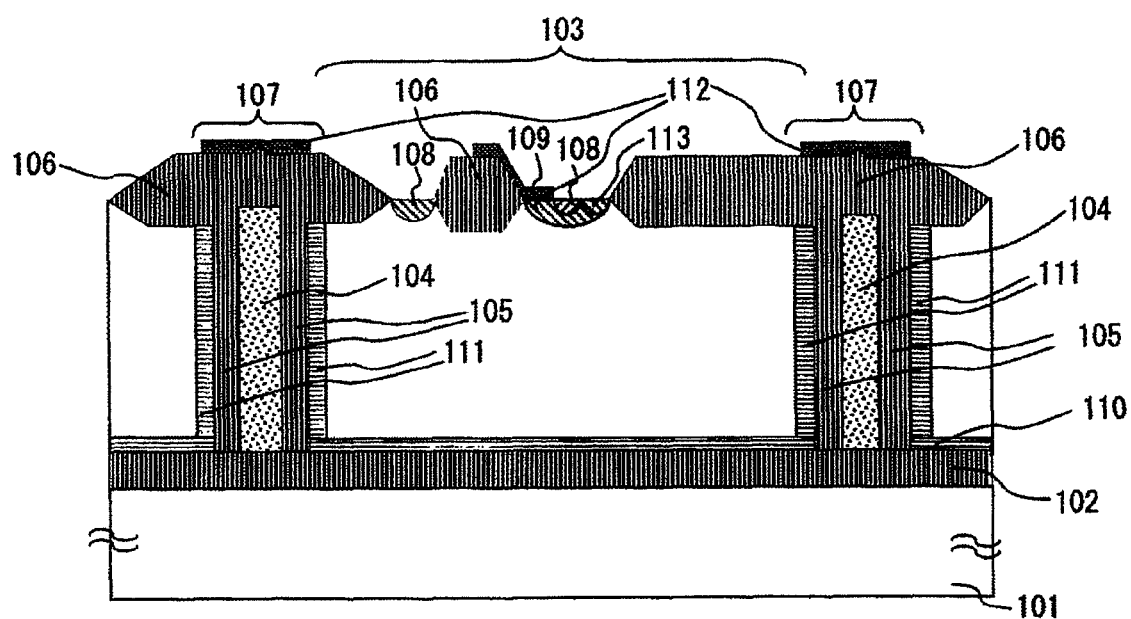
FIG. 1 is a cross-sectional view illustrating the semiconductor integrated circuit device prepared in Example 1.
Figure 2:
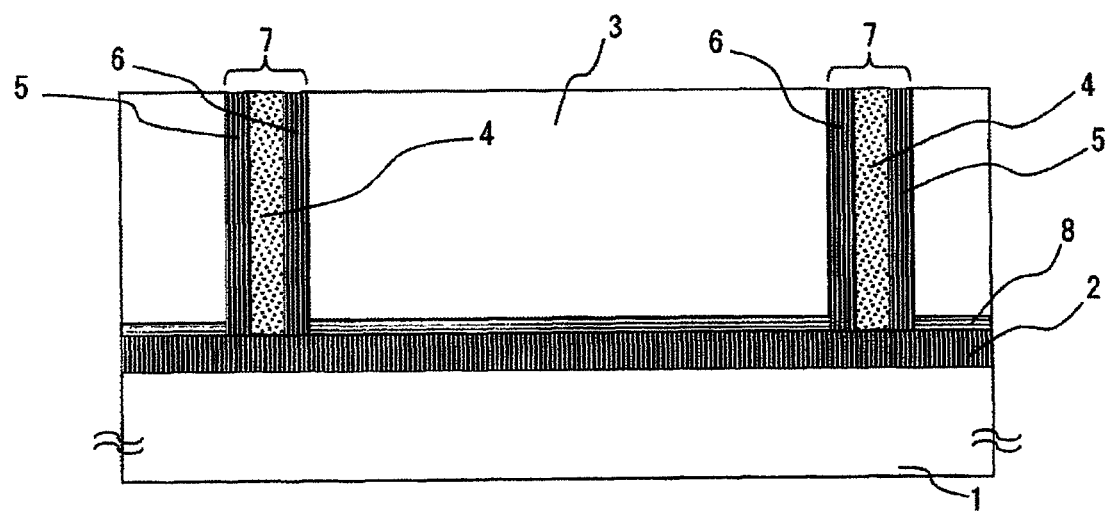
FIG. 2 is a cross-sectional view illustrating one example of semiconductor integrated circuit device prepared by a conventional technique.

BRIEF DESCRIPTION OF REFERENCE NUMERALS 1, 101: Silicon supporting substrate, 2, 102: Embedded oxide film, 3, 103, 103a, 103b, 501, 502: Element region, 4, 104: Embedded polycrystalline silicon film, 5, 6, 105: Side oxide film, 7, 107: Trench, 8: Embedded $n^+$ doped region, 106: Surface oxide film, 108: $N^+$ doped region, 109: P doped region, 110: Embedded $n^+$ doped region, 111: Side $n^+$ doped region, 112, 403: Polycrystalline silicon interconnection, 113: $P^+$ doped region, 114: One side of trench, 115: Photoresist, 301: Oxide film prepared by CVD, 401, 402: Indentations/protrusions, 503: Thick surface oxide film, 504: Formed surface oxide film, 505: silicon nitride film 601: $N^+$ doped emitter, 602: Gate electrode, 603: $P^+$ doped collector, 605: Silicon supporting substrate, 606: first silicon oxide film, 607: Trench, 610: $n^{--}$ lightly doped region, 700: Active device region, 800: Element isolating region, 704: Polycrystalline silicon layer, 705: Second silicon oxide film, 710: $n^+$ heavily doped region, 651: Thick oxide film, 652: Thin oxide film, 611: $n^+$ doped source, 631: $n^+$ doped drain region, 911: N-lightly doped drain region, 641: P doped well region, 612: $P^+$ doped source region, 632: $P^+$ doped drain region, 922: n lightly doped drain region

DETAILED DESCRIPTION OF THE INVENTION

The semiconductor integrated circuit device of the present invention uniformly applies a voltage to the oxide films formed on the trench sides at both sides by optimizing thicknesses of the oxide films formed on the basal plane, sides and upper segment of the trench by thermal oxidation while satisfying rated specifications of the device. It is described in detail by referring to the attached drawings.

Example 1

Figure 3:
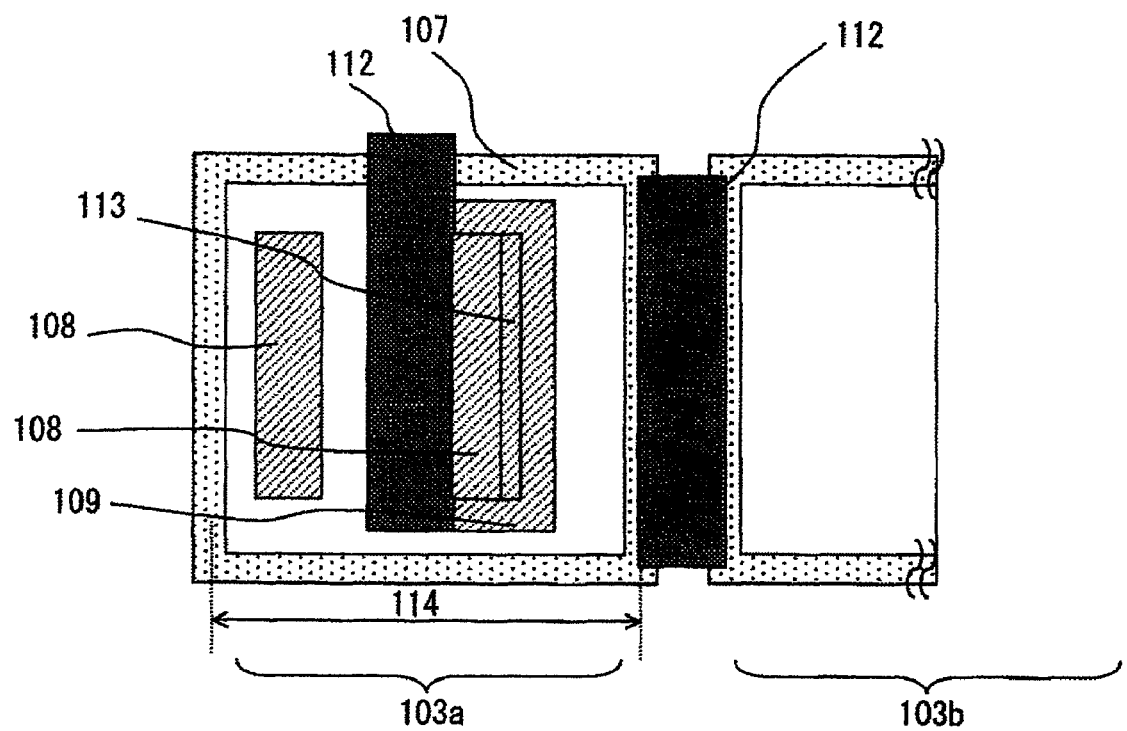
FIG. 3 is a plan view illustrating the semiconductor integrated circuit device prepared in Example 1.

The semiconductor integrated circuit devices of the present invention prepared in Examples are described by referring to the attached drawings. FIG. 1 is a cross-sectional view illustrating the semiconductor integrated circuit device prepared in Example 1, wherein 101: silicon supporting substrate, 102: embedded oxide film, 103: element region, 104: embedded polycrystalline silicon film, 105: side oxide film, 106: surface oxide film, 107: trench, 108: $n^+$ doped region, 109: p doped region, 110: embedded $n^+$ doped region, 111: side $n^+$ doped region, 112: polycrystalline silicon interconnection, and 113: $p^+$ doped region. FIG. 3 is a plan view illustrating the semiconductor integrated circuit device prepared in Example 1, wherein 103a and 103b: active device regions provided side by side, 112: polycrystalline silicon interconnection provided to step over the trench 107, and 114: one side of the trench. In Example 1, the device has a structure with the embedded polycrystalline silicon film 104 thermally surface-oxidized to form the thick surface oxide film 106 over the trench 107 to uniformly apply a voltage to the side oxide films 105 provided in the trench on both sides.

Figure 4:
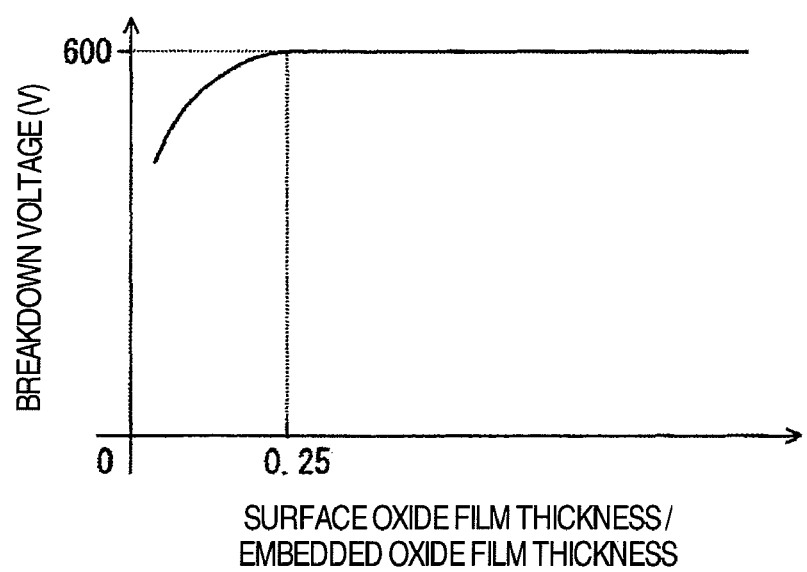
FIG. 4 presents the breakdown voltage measurement results of the semiconductor integrated circuit device prepared in Example 1.

Thickness of the trench surface oxide film 106 and that of the embedded oxide film were varied in a range from 0.1 to 3 µm to measure breakdown voltage. The results are given in FIG. 4. The dielectric strength voltage is 600 V or more, when the thickness ratio of the trench surface oxide film 106 to the embedded oxide film 102 is 0.25 or more. The relation illustrated in FIG. 4 is irrespective of one side 114 length and depth of the trench in a range from 50 to 100 µm and 200 to 2000 µm, respectively. It was observed, however, that the breakdown voltage greatly deteriorated when the trench was 50 µm deep or less, irrespective of thickness of the trench surface oxide film 106 and that of the embedded oxide film 102. These results indicate that the breakdown voltage improves when the above thickness ratio is set at 0.25 or more.

The wafer cross-sections were observed to locate dielectric breakdown sites with the samples having the thickness ratio of the trench surface oxide film 106 to the embedded oxide film 102 set at 0.1 and 0.2, and 0.5 and 0.7. A total of about 100 wafers of the same species were prepared to grasp the breakdown site distribution. Each of the wafers having the ratio of 0.1 or 0.2 showed the breakdown site only at one of the side oxide films 105 formed in the trenches 107 at both sides. On the other hand, each of the wafers having the ratio of 0.5 showed the breakdown sites at each of the side oxide films 105.

It is presumed, based on the observed results, that a voltage is applied unevenly to the side oxide films in the trench 107 at both sides with the wafer having the ratio of 0.25 or less, and evenly to the films with the wafer having the ratio above 0.25.

It is therefore presumed, based on these results, that a semiconductor integrated circuit device of high breakdown voltage can be realized when it has the thickness ratio above 0.25, because the side oxide films 105 formed in the trench 107 at both sides are evenly subjected to a voltage.

Figure 6:
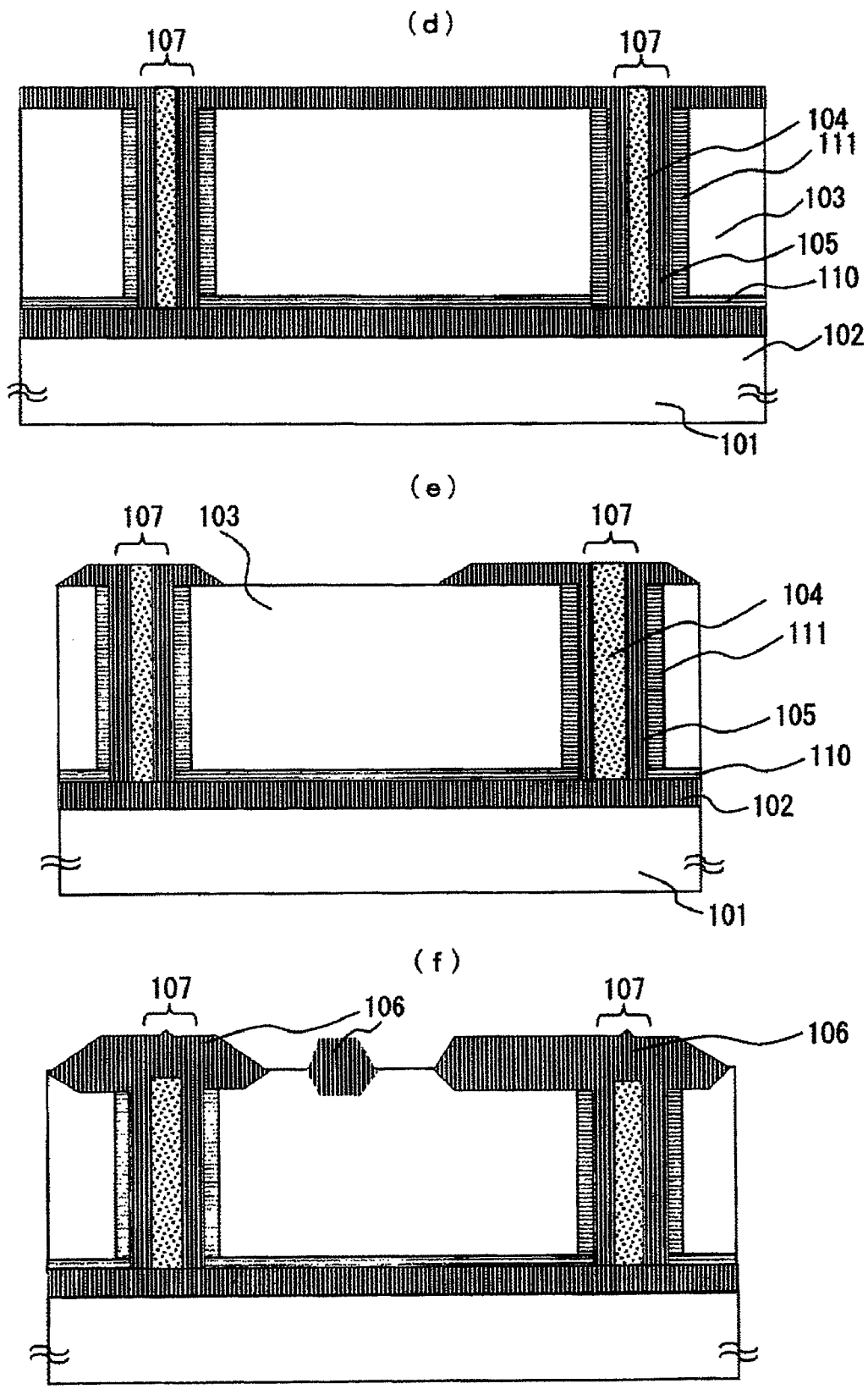
FIG. 6 illustrates the process steps for fabrication of the semiconductor integrated circuit device prepared in Example 1.
Figure 7:
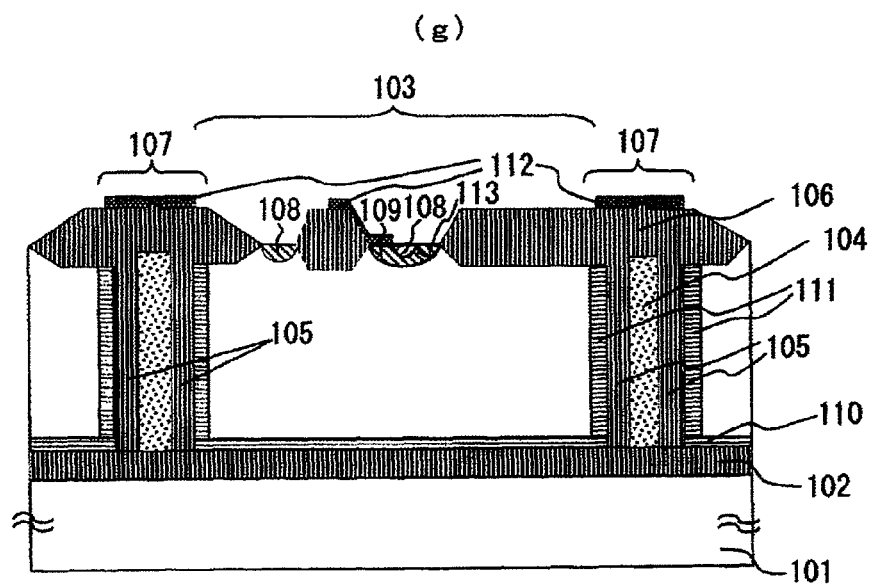
FIG. 7 illustrates the process steps for fabrication of the semiconductor integrated circuit device prepared in Example 1.

FIGS. 5 to 7 illustrate the process for fabrication of the dielectrically isolated substrate prepared in Example 1. Referring to these figures, the process comprises a step (a) for fabrication of the substrate, step (b) for oxidation in the trench, step (c) for embedding polycrystalline silicon in the trench, step (d) for isolation/polishing, step (e) for selectively removing the surface oxide film except that in the isolating region, including the upper trench segment, step (f) for surface oxidation, and step (g) for fabrication of the active element region, wherein the reference numeral 115 represents a photoresist.

An SOI substrate having the embedded n⁻ doped region 110 on the embedded oxide film 102 was prepared. The embedded n⁻ doped region 110 was formed with arsenic or antimony. It was then dry-etched with the photoresist 115 as a mask to form the trench 107 to a depth to come into contact with the embedded oxide film 102, as illustrated in FIG. 5 (a). Then, the side n⁺ doped region 111 was formed on each of the trench 107 sides by depositing antimony or phosphorus on the side walls, and the whole body of the substrate was oxidized, as illustrated in FIG. 5 (b). This formed the side oxide films 105 also in the trench 107. Then, the embedded polycrystalline silicon film 104 of polycrystalline silicon was formed on the substrate surface, which included the trenches 107, as illustrated in Fig. (c). Then, the entire substrate surface was mechanically polished to leave the embedded polycrystalline silicon film 104 only in the trench 107, as illustrated in FIG. 6 (d). The mechanically polished substrate was then treated by etching to selectively remove the surface oxide film except that in the isolating region, including the upper trench segment, as illustrated in FIG. 6 (e). Then, the isolating region including the upper trench segment was coated with the surface oxide film 106 by a common local oxidation method with a silicon nitride film, as illustrated in FIG. 6 (f). Finally, boron or phosphorus was implanted on part of the element region to form the active element regions, e.g., n⁺ doped region 108, p doped region 109 and p⁺ doped region 113, as illustrated in FIG. 6 (g).

In Example 1, the photoresist was used as an etching mask for forming the trench. However, the mask is not limited to a photoresist, but may be of a silicon oxide layer, silicon nitride layer or laminate of silicon oxide and silicon nitride layers. The embedded layer is also not limited to the polycrystalline silicon film 104, and may be of amorphous silicon or the like.

Example 2

Figure 8:
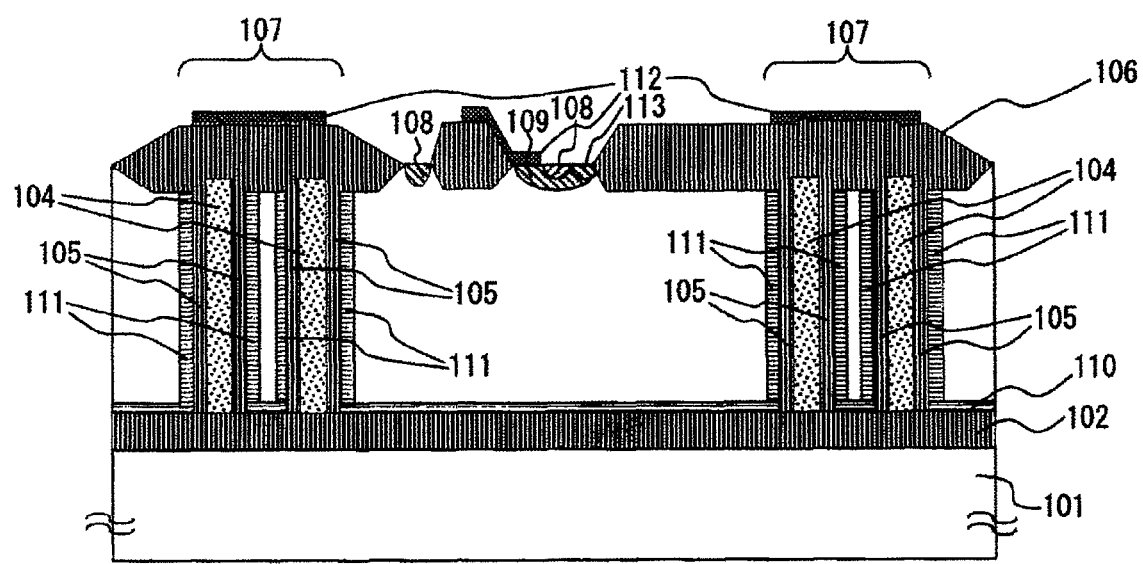
FIG. 8 is a cross-sectional view illustrating the semiconductor integrated circuit device prepared in Example 2.

FIG. 8 is a cross-sectional view illustrating the semiconductor integrated circuit device prepared in Example 2, where a plurality of the trenches 107 were formed in the isolating region. FIG. 8 shows the space enclosed by the two trenches. The device is generally designed to secure a rated breakdown voltage by one trench. Providing a plurality of the trenches 107 can greatly reduce defectives which are formed in the trenches in the production process to increase percent defective.

Figure 9:
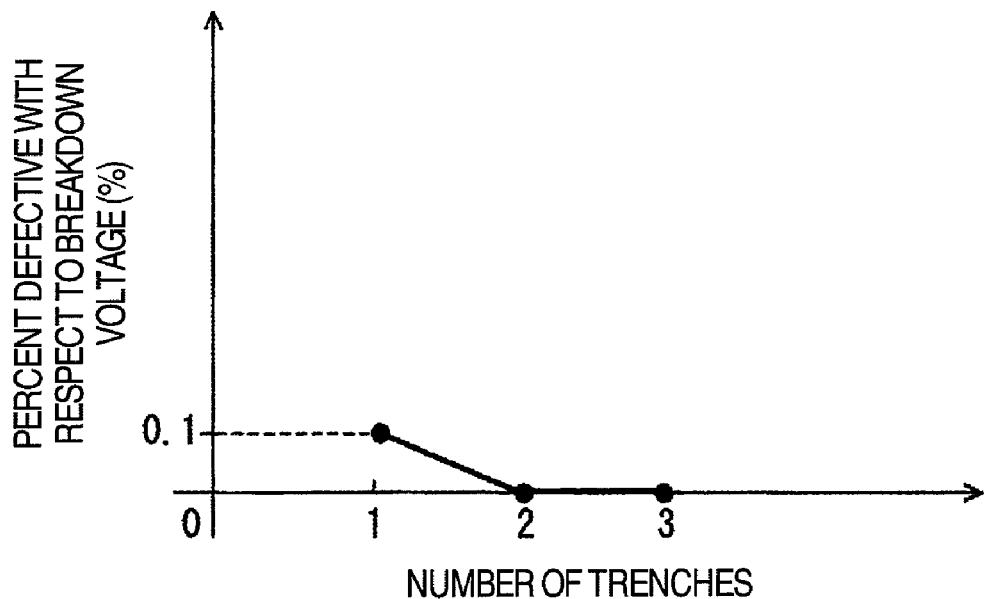
FIG. 9 shows the relation between breakdown voltage and number of trenches for the semiconductor integrated circuit device prepared in Example 2.

FIG. 9 shows percent defective of breakdown voltage, plotted against number of trenches. As shown, the percent defective can be reduced when a plurality of the trenches 107 are provided, as is the case with the device prepared in Example 2, wherein the percent defective is defined as percentage of devices having a breakdown voltage lower by 30% or more than the average voltage of a total of 2000 devices tested. These results indicate that the percent defective of breakdown voltage can be reduced by providing a plurality of trenches, as observed with the devices prepared in Example 2.

Example 3

The semiconductor integrated circuit device prepared in Example 3 is characterized by reduced thickness of the side oxide film 105 formed in the trench. Reducing the thickness can reduce a stress evolving in the interface between silicon oxide and silicon in the side oxide film forming step, and hence the percent defective.

Figure 10:
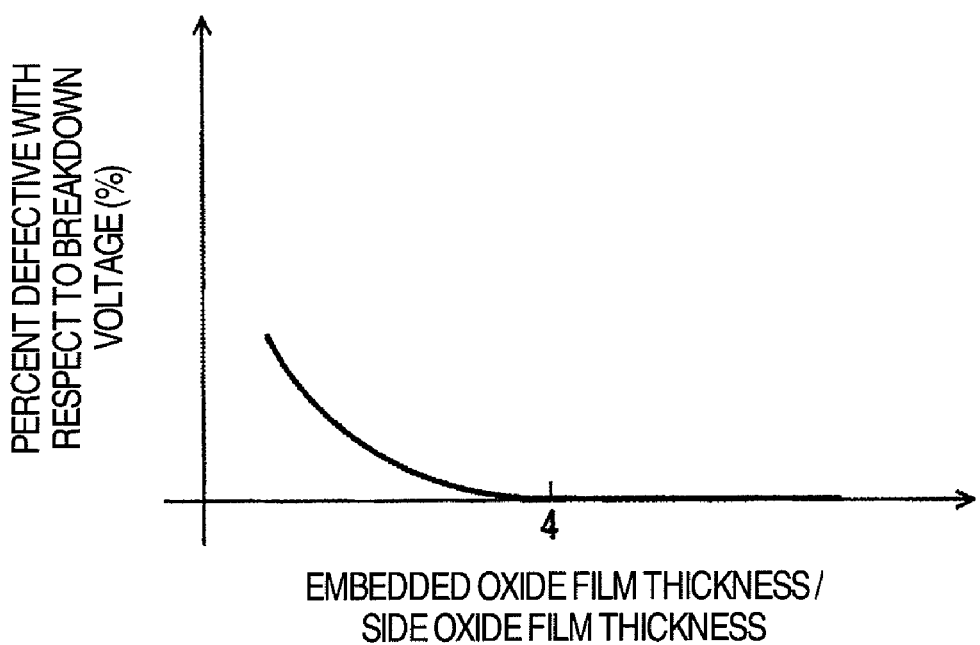
FIG. 10 shows the relation between breakdown voltage and oxidation film thickness ratio of the semiconductor integrated circuit device prepared in Example 3.

FIG. 10 shows percent defective of dielectric strength voltage, plotted against the thickness ratio of the embedded oxide film 102 to the side oxide film 105 in the trench. A total of 1000 different integrated circuit devices were measured, and the percent defective is defined as percentage of the devices having a breakdown voltage lower by 30% or more than the average voltage. As illustrated, the percent defective decreases as the ratio increases to 4 or more.

The devices showing a high percentage defective were investigated to identify the causes for insufficient breakdown voltage. The insufficient breakdown voltage was found to result from defects in the element region 103, based on which it is presumed that defects evolve in the devices having a lower thickness ratio to increase the percent defective.

These results indicate that increasing the thickness ratio to 4 or more gives the semiconductor integrated circuit device of high reliability.

Example 4

Figure 11:
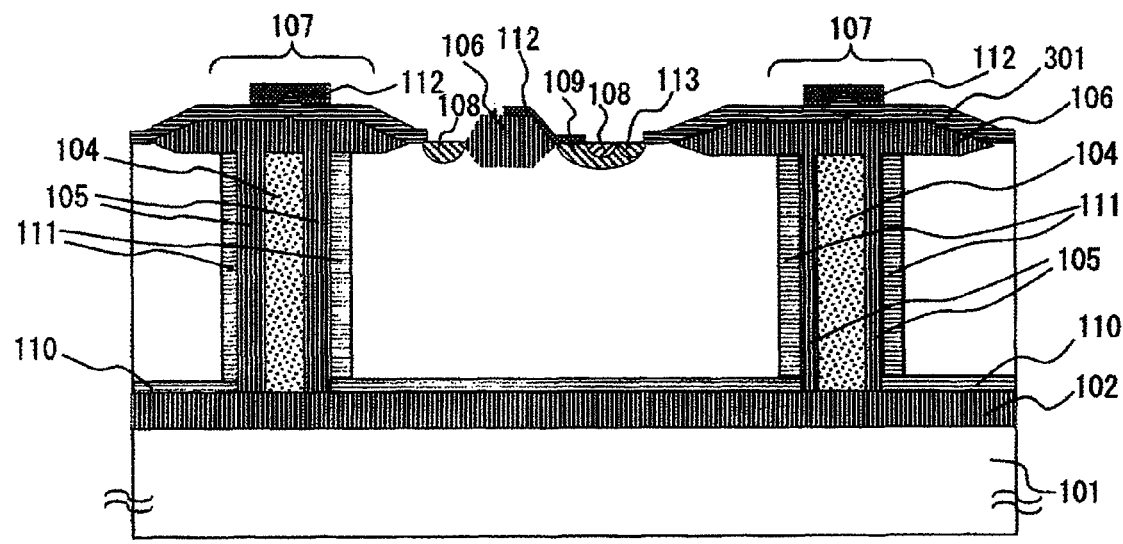
FIG. 11 is a cross-sectional view illustrating the semiconductor integrated circuit device prepared in Example 4.

FIG. 11 is a cross-sectional view illustrating the semiconductor integrated circuit device prepared in Example 4, where the reference numeral 301 represents an oxide film produced by CVD. The device is characterized by a combination of the surface oxide film 106 and oxide film 301 prepared by CVD on the trench surface. This structure increases thickness of the combined oxide film on the trench surface to uniformly apply a voltage to the side oxide films 105 formed in the trench at both sides.

The above procedure can reduce thickness of the surface oxide film 106, and hence stress evolving in the interface between silicon oxide and silicon, to decrease percent defective resulting from the associated defects.

Figure 12:
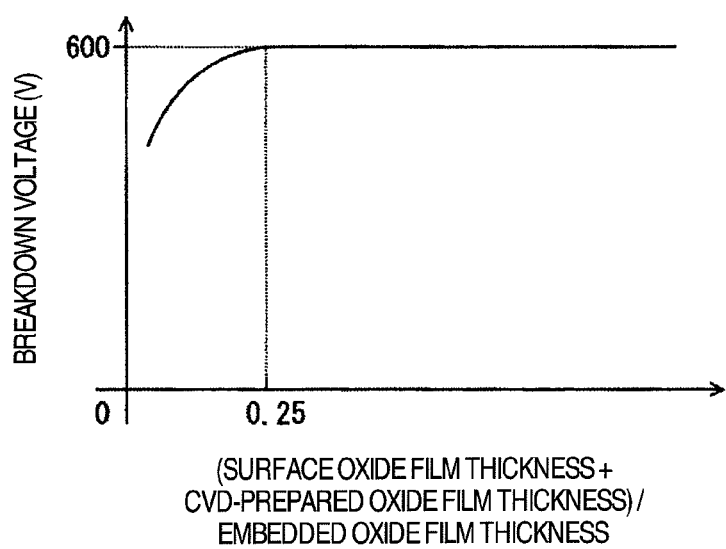
FIG. 12 presents the breakdown voltage measurement results of the semiconductor integrated circuit device prepared in Example 4.

FIG. 12 presents the relation between breakdown voltage and thickness of the oxide film 106 on the trench surface. The strength increases to 600 V or more, when the thickness ratio of the combined surface oxide film 106 and CVD-prepared oxide film 301 on the trench surface to the embedded oxide film 102 increases is 0.25 or more. These results indicate that breakdown voltage improves when the ratio is set at 0.25 or more.

The wafer cross-sections were observed to locate dielectric breakdown sites with the samples having the thickness ratio of the combined surface oxide film 106 and CVD-prepared oxide film 301 on the trench surface to the embedded oxide film 102 set at 0.1 and 0.2, and 0.5 and 0.7, in a manner similar to that in Example 1. A total of about 100 wafers of the same species were prepared to grasp the breakdown site distribution. Each of the wafers having the ratio of 0.1 or 0.2 showed the breakdown site only at one of the side oxide films 105 formed in the trenches 107 at both sides. On the other hand, each of the wafers having the ratio of 0.5 or 0.7 showed the breakdown sites at each of the side oxide films 105.

It is presumed, based on the observed results, that a voltage is applied unevenly to the side oxide films in the trench at both sides of the wafer having the ratio of 0.1 or 0.2, and evenly to the films of the wafer having the ratio of 0.3 or 0.4.

It is therefore presumed, based on these results, that a semiconductor integrated circuit device of high breakdown voltage can be realized when it has the thickness ratio of 0.25 or more.

Example 5

Figure 13:
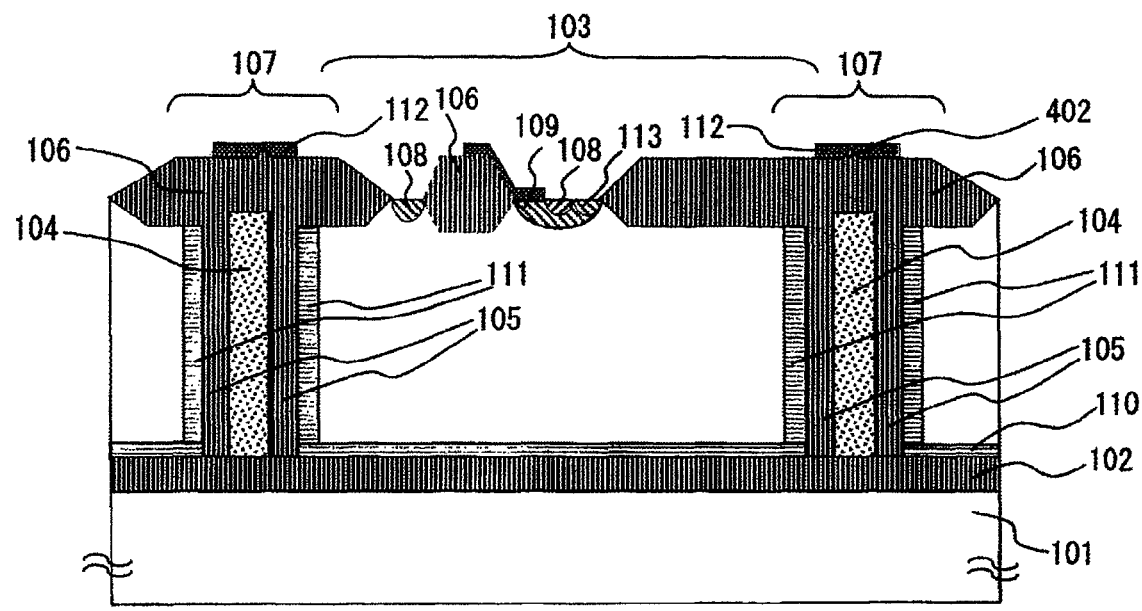
FIG. 13 is a cross-sectional view illustrating the semiconductor integrated circuit device prepared in Example 5.

FIG. 13 is a cross-sectional view illustrating the semiconductor integrated circuit device prepared in Example 5, where the reference numeral 402 represents indentations/protrusions on the oxide film 106 on polycrystalline silicon embedded in the trench. The device prepared in Example 5 is structurally characterized by decreased height of the indentations/protrusions 402 to control interconnection disconnection caused by them.

Figure 14:
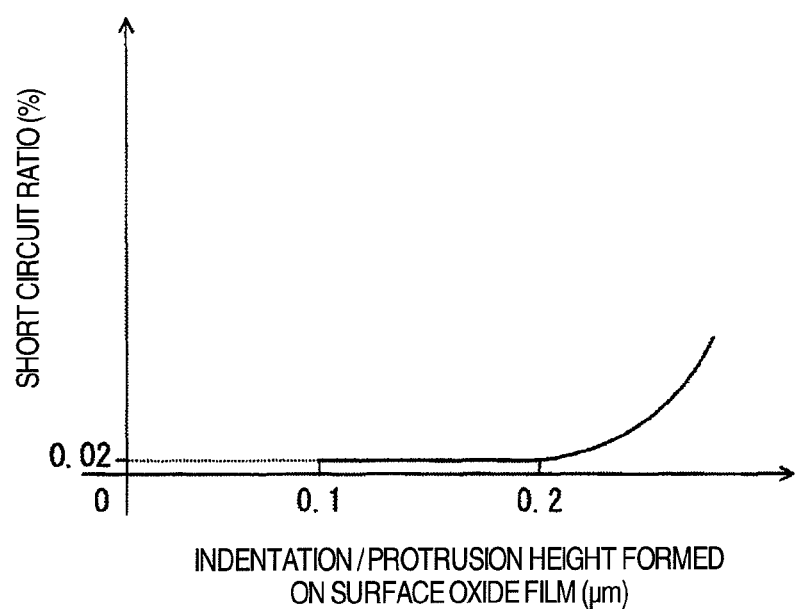
FIG. 14 presents the relation between short circuit ratio and surface indentation/protrusion height.

FIG. 14 presents the relation between short circuit ratio and indentation/protrusion height, wherein "short circuit ratio" on the axis of ordinate means ratio of disconnected polycrystalline silicon interconnections 112 on the surface oxide film 106 (disconnected interconnections/observed interconnections), and "indentation/protrusion height" on the axis of abscissa means distance from the protrusion apex to the bottoms of the adjacent indentations or to the flat segment when there is one protrusion, and distance from the highest protrusion apex and lowest indentation bottom when there are a plurality of protrusions. As shown in FIG. 14, the short circuit ratio can be decreased to 0.02% or less by keeping height of the indentation/protrusion shown in FIG. 13 at 0.2 μm or less.

Figure 15:
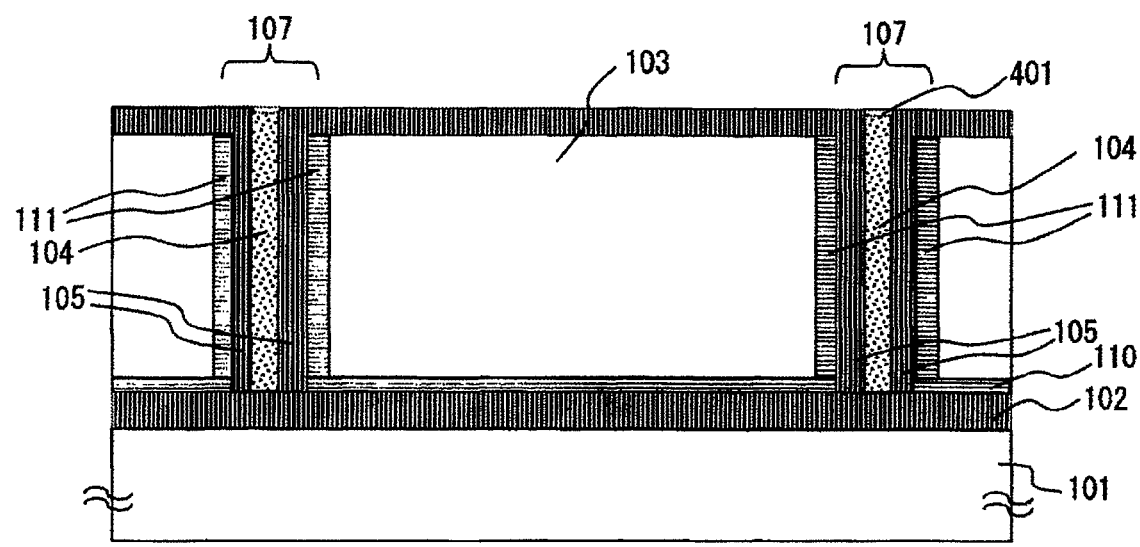
FIG. 15 is a cross-sectional view illustrating the etched-back semiconductor integrated circuit device prepared in Example 5.

FIG. 15 is a cross-sectional view illustrating the etched-back device prepared by anisotropic dry etching, wherein the reference numeral 402 represents the indentations/protrusions in the etched-back device. The etching back step was placed between the step (d) for isolation/polishing and step (e) for selectively removing the surface oxide film except that in the isolating region, including the upper trench segment, to selectively etch back the embedded polycrystalline silicon film 104 on the trench inside walls.

Example 6

Figure 16:
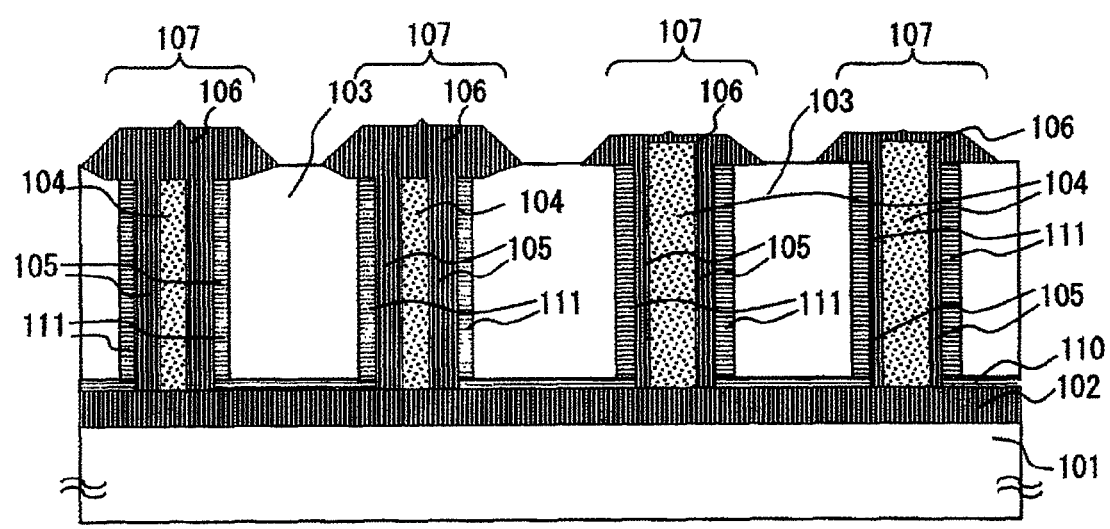
FIG. 16 is a cross-sectional view illustrating the semiconductor integrated circuit device prepared in Example 6.

Example 6 studied an integrated circuit device having element regions of different surface oxide film thickness. FIG. 16 is a cross-sectional view illustrating the semiconductor prepared in Example 6, wherein the n$^+$ doped region 108, p doped region 109, polycrystalline silicon interconnection 112 and p$^+$ doped region 113 are omitted. The device can have a semiconductor element needing a high voltage of 600 V or more and semiconductor element working at a lower voltage, assembled in the limited element region by forming element regions of different surface oxide film thickness.

Figure 17:
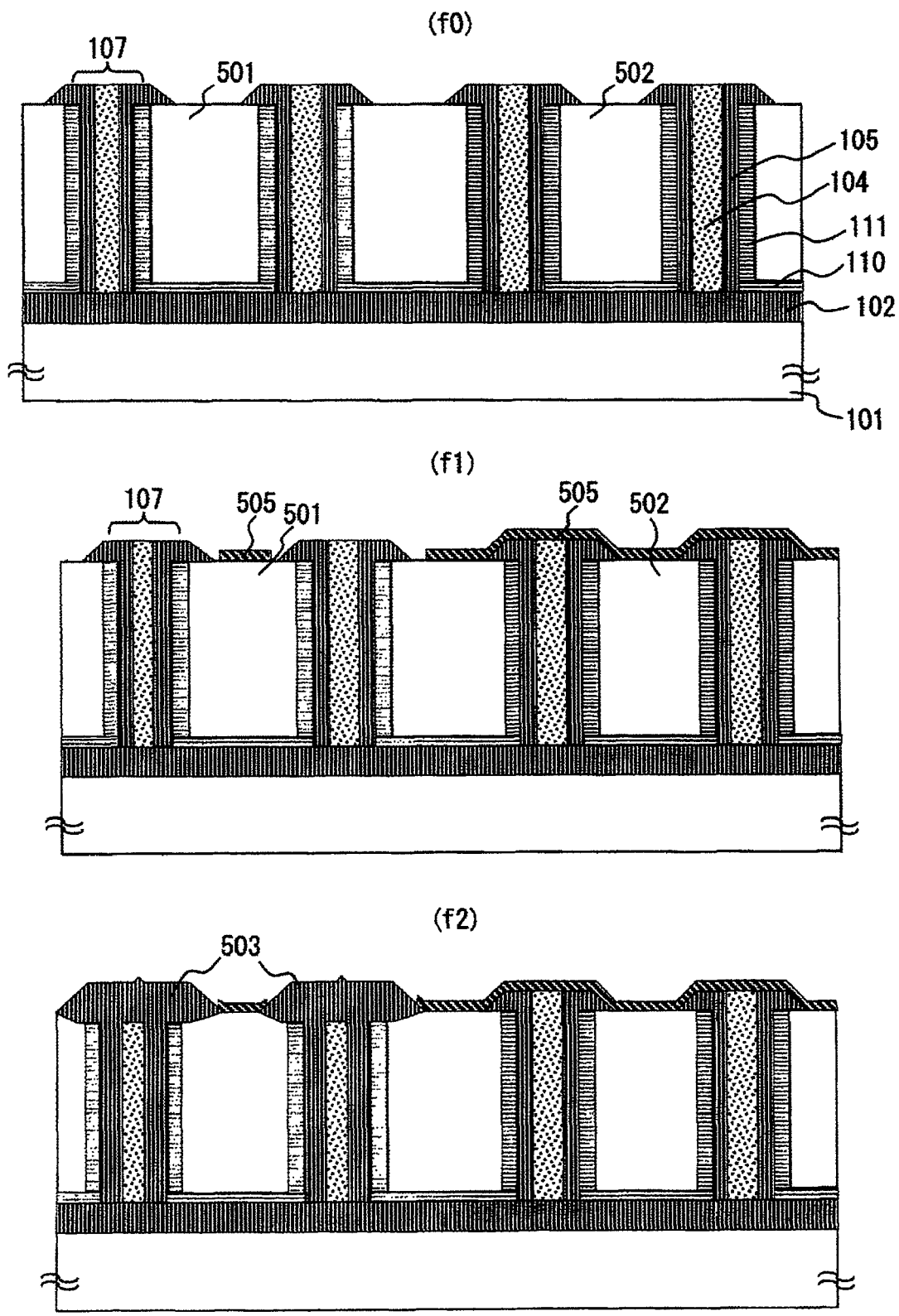
FIG. 17 illustrates the process for fabrication of the semiconductor integrated circuit device prepared in Example 6.

The process described in Example 6 for fabrication of a dielectrically isolated substrate comprised the same steps as in Example 1, except for the surface oxidation step. FIGS. 17 and 18 illustrate only the surface oxidation step in the process for fabrication of the dielectrically isolated substrate. In FIG. 17, 501: element region in which a semiconductor element of high breakdown voltage is formed, 502: element region in which a semiconductor element of low breakdown voltage is formed, 503: thick surface oxide film formed on the trench which encloses the region 501, 504: surface oxide film formed on the trench which encloses the region 502, and 505: silicon nitride film. FIG. 17 (f0) to (f2) illustrate a sub-step, as part of the surface oxidation step, for oxidizing the surface of the isolating region including the trench which encloses the region 501. FIG. 18 (f3) to (f5) illustrate a sub-step, as part of the surface oxidation step, for oxidizing the surface of the isolating region including the trench which encloses the region 501, and for oxidizing the surface of the isolating region including the trench which encloses the region 502. The surface oxidation step adopted in Example 6 is described in detail.

First, the silicon nitride film 505 was formed on the device except the surface of the isolating region including the upper segment of the trench 107 which encloses the element region 501 with the adjacent trench 107 (FIG. 17 (f1)). Next, the thick oxide film 503 was formed selectively on the isolating region including the trench 107 which encloses the region 501 (FIG. 17 (f2)). Then, the silicon nitride film 505 was removed selectively from the surface of the isolating region including the trench 107 which encloses the region 502 (FIG. 18 (f3)). Then, the thick surface oxide film 503 and surface oxide film 504 were formed on the surfaces of the isolating regions including the trenches which enclose the regions 501 and 502 (FIG. 18 (f4)). Finally, the silicon nitride film 505 was totally removed (FIG. 18 (f5)).

Other embodiments of the present invention are described in detail by referring to the attached drawings (FIGS. 21 to 32). In all of these drawings for describing the embodiments or conventional techniques, the same or similar components are marked with the same or similar reference numerals, in principle, to avoid duplicated description.

First, concept of the embodiments of the present invention is briefly described. The dielectrically isolated semiconductor devices prepared in the embodiments adopt a semiconductor, in particular silicon semiconductor, and a silicon on insulator (SOI) substrate, which is advantageous for dielectric isolation. It has a deep trench extending from the principal substrate surface to an intermediate silicon oxide film. The trench is filled with a silicon oxide film, polycrystalline silicon and the like, after side n$^+$ heavily doped layers are formed on the trench inner walls in a self-aligning manner utilizing the trench opening, to produce a dielectrically isolated structure. Then, a thick oxide film is formed by local oxidation of silicon (LOCOS) in given regions to enclose regions in which elements, e.g., IGBT, MOS transistor, diode and so forth are formed. A source region, drain region and other active regions are formed by a process for forming gate oxide film, forming and treating a polycrystalline silicon film as a gate electrode, common ion implanting process and thermal treating process, to produce the semiconductor device.

Example 7

Figure 21:
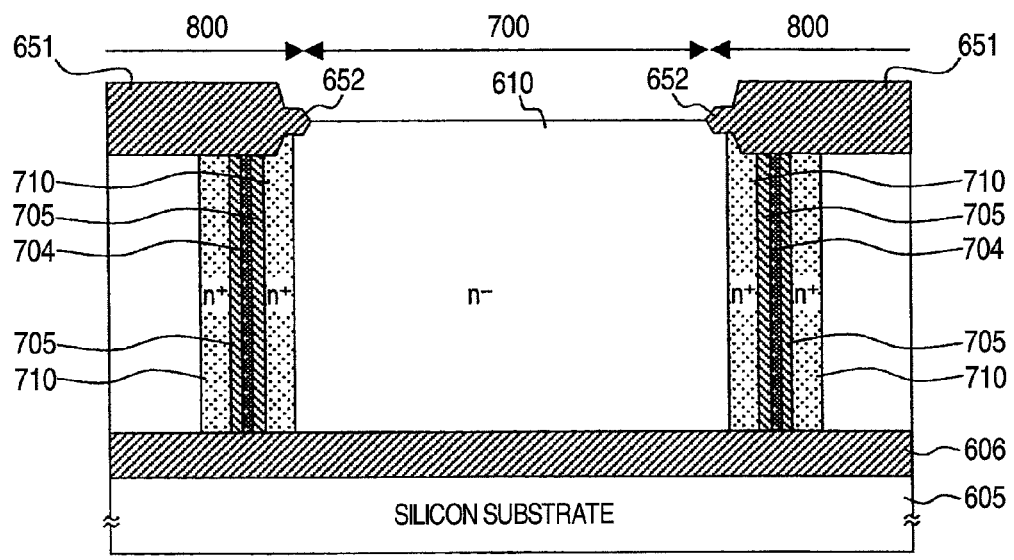
FIG. 21 is a cross-sectional view illustrating the dielectrically isolated semiconductor device of the present invention prepared in Example 7.

FIG. 21 is a cross-sectional view illustrating the dielectrically isolated semiconductor device prepared in Example 7, wherein one element is dielectrically isolated in one active device region (region 700 in this case), and other active devise regions for other elements are not shown. The substrate is of an SOI structure, with the silicon-supporting substrate 605 supporting the first silicon oxide film 606 and high-resistance (lightly doped) $n^{---}$-type active silicon layer 610. A trench (refer to the trench 607 in FIG. 26) runs almost vertically from the principal surface of the $n^{---}$-type substrate 610 to the silicon oxide film 606. The trench has a planar shape to form a closed loop, and functions to dielectrically isolate the inside and out side from each other. The dielectrically isolating trench is placed between the $n^+$ heavily doped layers 710. It is held between the $n^+$-type heavily doped layers 710, and filled with the second silicon oxide films 705 adjacent to each of the layers 710 which hold the polycrystalline silicon 704 in-between, to form the element isolating region 800. The upper surface region of the region 800 is composed of the thick silicon oxide film 651 (sufficiently thick to prevent dielectric breakdown) and thin oxide film 652.

Figure 22:
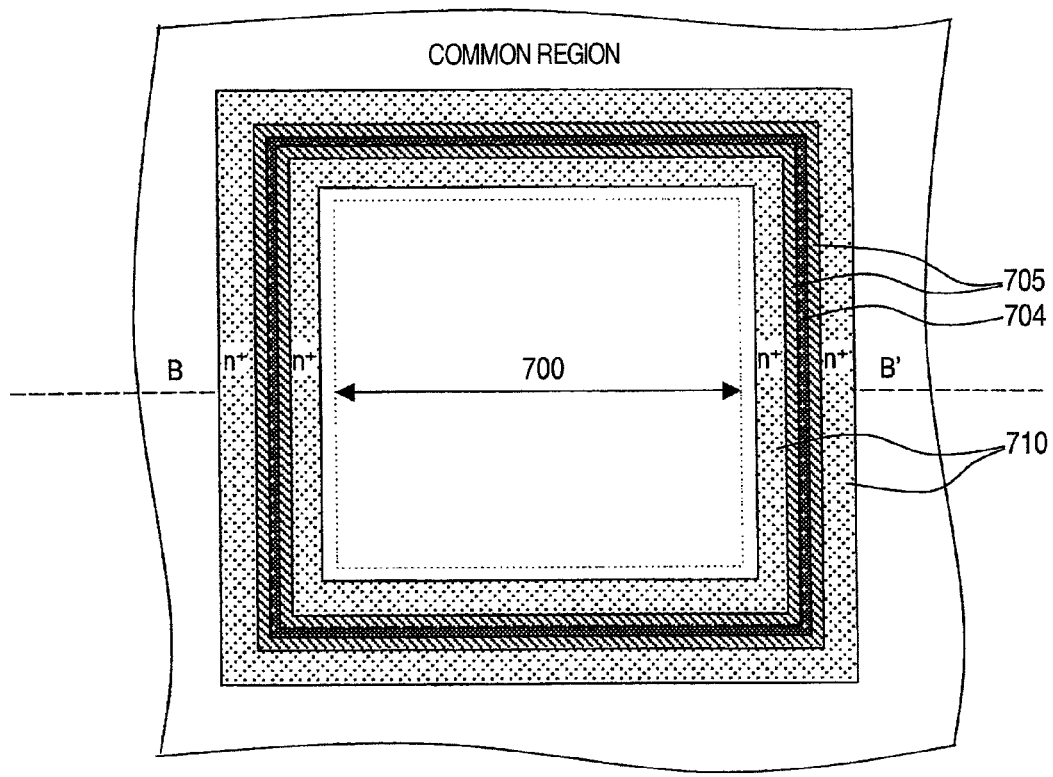
FIG. 22 is a plan view illustrating the dielectrically isolated semiconductor device of the present invention prepared in Example 7.

FIG. 22 is a plan view illustrating the dielectrically isolated semiconductor device, corresponding to the cross-sectional view shown in FIG. 21. As illustrated, the active device region 700 is isolated from the peripheral region composed of the $n^+$ heavily doped layers 710, silicon oxide films 705 and polycrystalline silicon 704. FIG. 21 is FIG. 22 cut along the broken line B-B'.

In FIGS. 21 and 22, the $n^{---}$-type active silicon layer 610 is the layer in which an element is formed, its thickness being determined in consideration of voltage rating of the element. The semiconductor device of the present invention includes various integrated semiconductor elements having a breakdown voltage voltage in a wide range. It is necessary to determine thickness of the $n^{---}$-type active silicon layer 610 based on the highest voltage rating. FIG. 23 (a) presents the relation (represented by a linear straight line) between voltage rating and $n^{---}$-type active silicon layer 610 thickness. Its thickness should fall into the cross-hatched region, thicker than the straight line.

Referring to FIG. 23 (a), assuming that the highest voltage rating is 600 V, the $n^{---}$-type active silicon layer 610 should be at least 50 μm thick. The $n^{---}$-type active silicon layer 610 having a thickness satisfying the above relation prevents the depletion layer extending therein from coming into contact with the intermediate embedded oxide film 6, leaving the neutral $n^{---}$-type layer region which is not turning into a depletion layer, as illustrated in FIG. 23 (b). Capacitive coupling with the supporting substrate 605 can be avoided by setting a potential in the neutral region at an adequate level, thereby solving element malfunction caused by noise propagating from the supporting substrate 605, which is a trouble possibly occurring in a conventional structure. Depletion layer thickness is correlated with voltage rating by the formula: depletion layer thickness $\propto K\sqrt{}$ (voltage rating), where K is a constant.

Example 8

An oxide film in a dielectrically isolated semiconductor device is preferably as thin as possible, although an excessively thin film unavoidably decreases extent of element isolation. The device prepared in Example 8 has a multiple isolation structure, to secure thickness of the oxide film at an adequate level or more.

Figure 24:
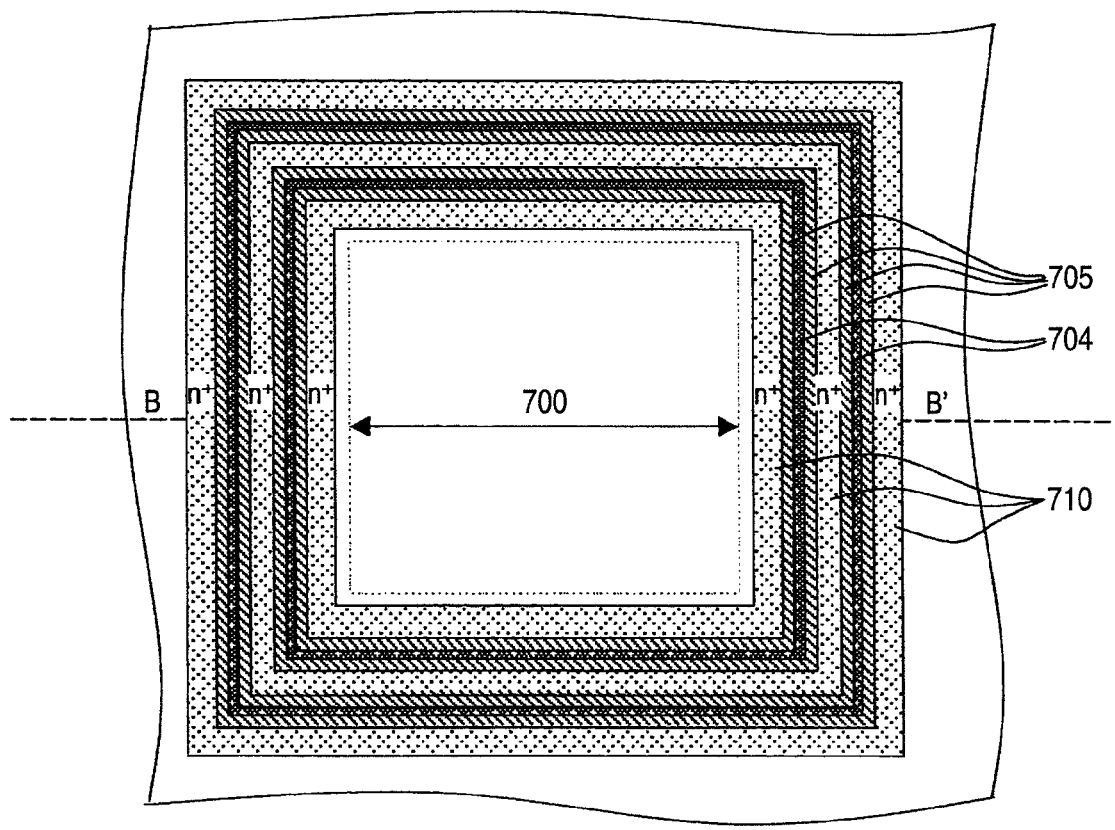
FIG. 24 is a cross-sectional view illustrating the dielectrically isolated semiconductor device of the present invention prepared in Example 8.
Figure 25:
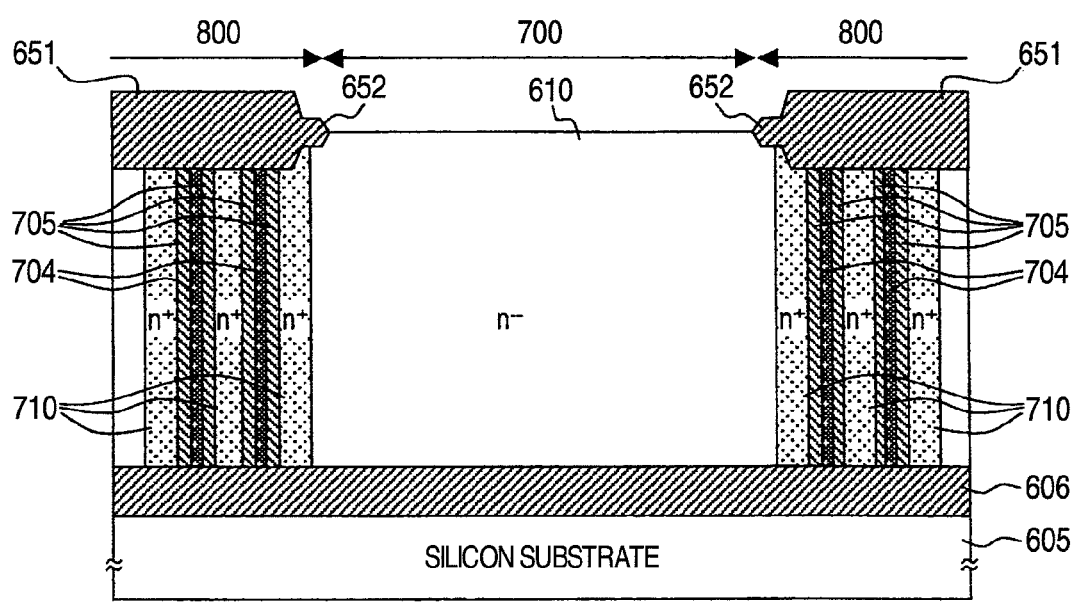
FIG. 25 is a plan view illustrating the dielectrically isolated semiconductor device of the present invention prepared in Example 8.

FIGS. 24 and 25 are a respective plan and cross-sectional views illustrating the dielectrically isolated semiconductor device prepared in Example 8.

The dielectrically isolated semiconductor device prepared in Example 8 comprises the active device region 700 enclosed by the 2 polycrystalline silicon layers 704, 4 oxide films 705 each adjacent to the layer 704 and 3 $n^+$ heavily doped layers 710 each adjacent to the layer 705, and is isolated from the peripheral region in the horizontal directions. A multiple, horizontally isolating structure, e.g., the one prepared in Example 8, can greatly reduce percent defective associated with breakdown voltage for element isolation. For example, a device of large active device region may have foreign matter deposited on part of the periphery of the oxide layer 705 in the production process for dielectric isolation, increasing possibility of deteriorating dielectric characteristics at the affected portion. The multiple structure can avoid defective dielectric isolation resulting from contamination with foreign matter, which may be unavoidable. More specifically, the second layer can realize dielectric isolation even when the first layer is defective, to assure reliability of the semiconductor device.

Moreover, the oxide film 705 of multiple structure can reduce thickness of one oxide film and hence reduce effects of stress evolving in the oxide film production process, which is another notable advantage of the device prepared in Example 8.

The polycrystalline silicon film 704, oxide film 705 and $n^-$ heavily doped layer 710 have a respective double, quadruple and triple structure in Example 8. However, increasing multiplicity of these films enclosing the active device region 700 further improves breakdown voltage of the device in the horizontal directions. It is generally preferable that the polycrystalline silicon film 704, oxide film 705 and $n^+$ heavily doped layer 710 have a respective n-, 2n- and (n+1)-multiple structure. In this multiple structure, the oxide film 705 invariably comes into contact with the $n^+$ heavily doped layer 710 on the side to prevent expansion of the dislocation, driven by an oxidation-induced stress. A structure with the $n^+$ heavily doped layer 710 between the trenches 607 (refer to FIG. 8) can control expansion of the element area while keeping a necessary element isolating region width, because each trench contains no $n^{---}$-type active silicon layer 710.

Figure 26:
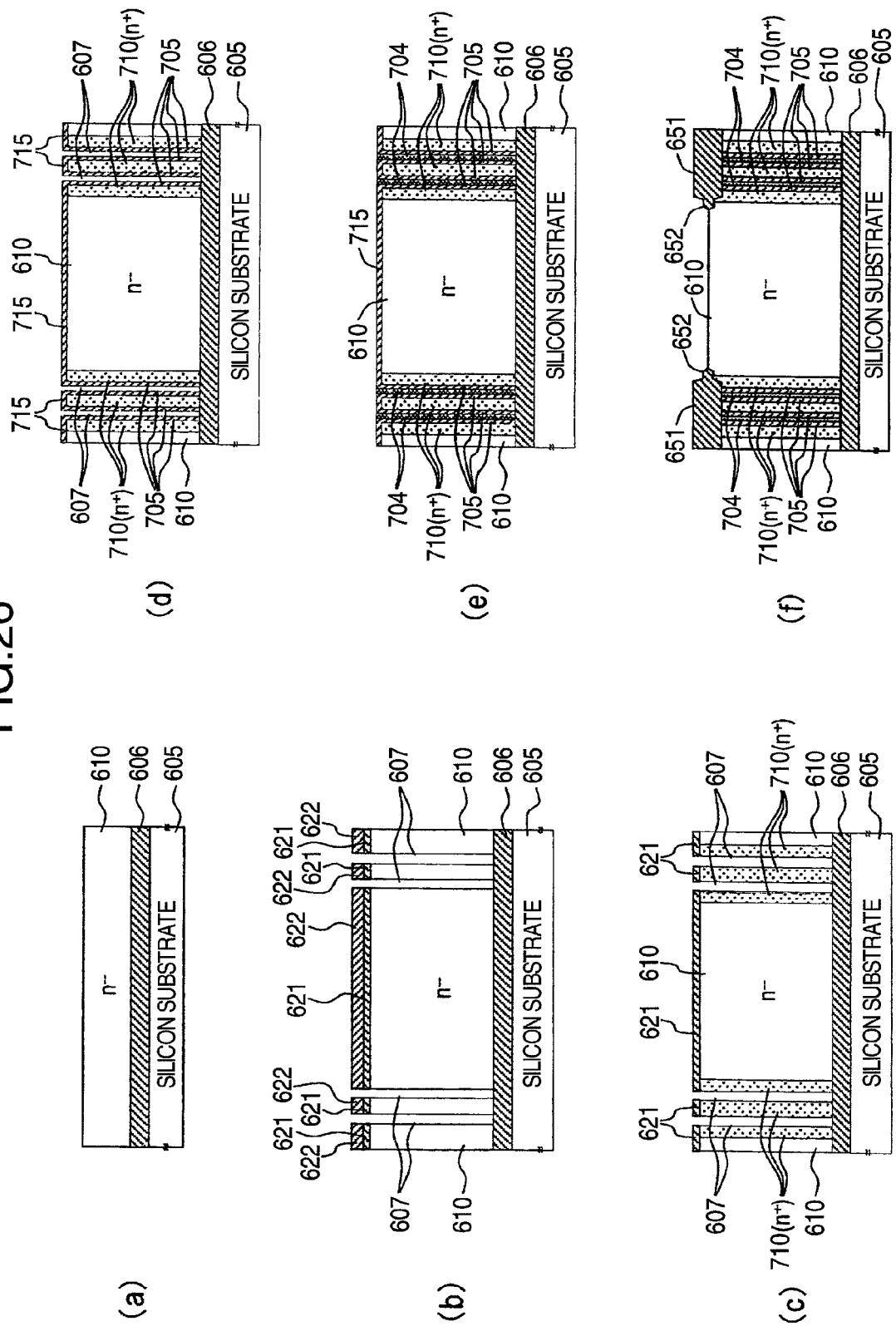
FIG. 26 illustrates the process for fabrication of the semiconductor integrated circuit device of the present invention prepared in Example 8.

FIG. 26 illustrates the process for fabrication of the dielectrically isolated semiconductor device prepared in Example 8.

First, an SOI substrate is prepared, which has the silicon substrate 605 coated with the silicon oxide film 606 and $n^{---}$-type active silicon layer 610 in this order on one side (FIG. 26 (a)).

Next, referring to FIG. 26 (b), the $n^{---}$-type active silicon layer 610 is coated, on the principal surface, with the oxide film 621 by CVD and with the photoresist 622 by a common dry etching technique, in this order. The resulting laminate is treated in a dry etching apparatus which produces a high-density plasma to provide the deep trench 607 vertically running to the embedded silicon oxide film 606. The trench 607 prepared in Example 8 is around 2 μm wide and 20 to 80 μm deep.

Referring to FIG. 26 (c), the resist 620 used for patterning the CVD-prepared oxide film 621 and forming the deep trench 607 in the $n^{---}$-type active silicon layer 610 is removed, and an n-type impurity, e.g., antimony (Sb), arsenic or phosphorus, is diffused by a vapor-phase process selectively into the $n^{---}$-type active silicon layer 610, exposed on the trench 607 side with the CVD-prepared oxide film 621 as the mask, to form the $n^-$ heavily doped layer 710. Width of the $n^+$ heavily doped layer 710 is controlled by vapor-phase diffusion treatment temperature and time.

Referring to FIG. 26 (d), the CVD-prepared oxide film 621 is then removed to expose the silicon surface. Subsequent heat treatment in an oxidative atmosphere forms the silicon oxide film 715 and 705 of substantially uniform thickness on the silicon surface, on the $n^{---}$-type active silicon layer 610 and trench 607 side walls, respectively. The oxide film 705 is formed on the trench sides by a thermal oxidation process, which is advantageous in that it can form the oxide film of uniform thickness on the exposed trench sides, even when the trench is narrow at 2 μm or less and 80 μm deep.

Referring to FIG. 26 (e), the oxide film 705 formed on the trench 607 sides have gaps, which are filled with the polycrystalline silicon film 704 formed by CVD. When the trench 607 is narrow, on the other hand, the oxide film 705 formed on one of the trench sides in the step illustrated in FIG. 8 (d) comes into contact with the opposite oxide film 705 at around the trench center, while the film 705 is growing, which creates a large compressive stress on the silicon side to cause dislocation. It is therefore necessary to carefully set extent of oxidation on the trench sides in relation to trench width. The step adopted in Example 8, illustrated in FIG. 26 (d), is an excellent step for avoiding the above stress-caused problems, because it leaves the gaps which are filled with polycrystalline silicon in the step illustrated in FIG. 26 (e).

Finally, a thick oxide film is formed selectively in the element isolating region by thermal oxidation in the step illustrated in FIG. 26 (f), to complete fabrication of the dielectrically isolated substrate.

Example 9

Figure 27:
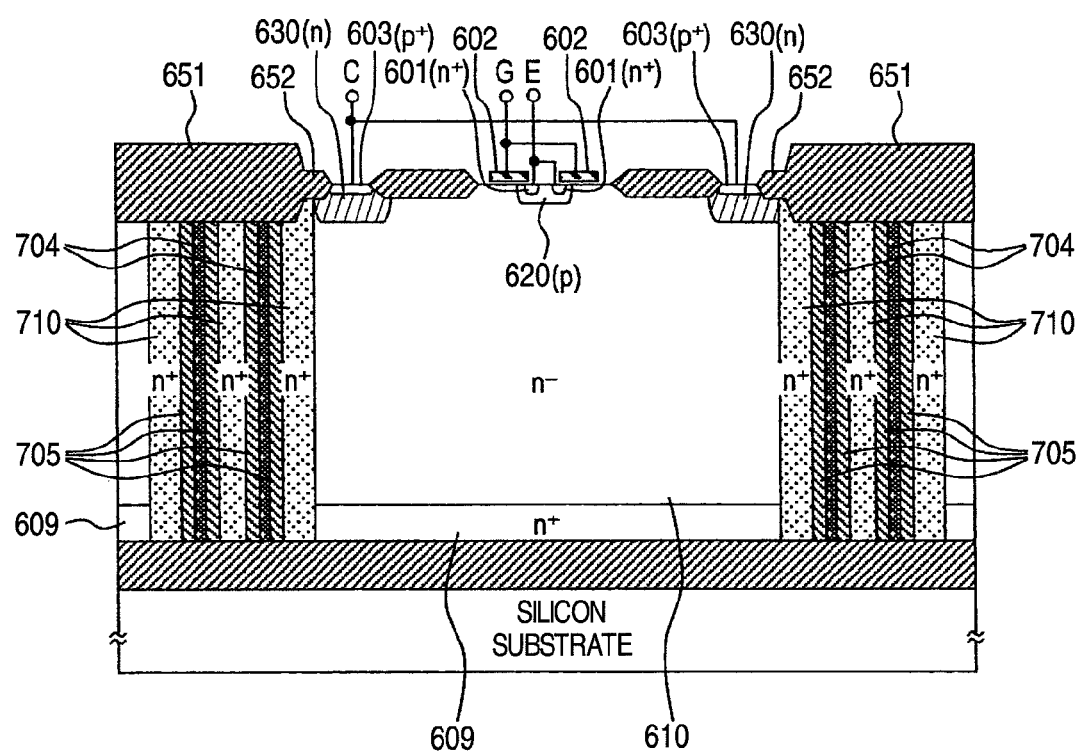
FIG. 27 is a cross-sectional view illustrating the dielectrically isolated semiconductor device of the present invention prepared in Example 9.

FIG. 27 is a cross-sectional view illustrating the dielectrically isolated semiconductor device prepared in Example 9, which uses an IGBT of high breakdown voltage.

The embodiment of Example 9 differs from the dielectrically isolated semiconductor device illustrated in FIG. 24 or 25 in that the n$^+$ heavily doped layer 609 is provided on the basal plane on which the active silicon layer 610 formed next to the first oxide film 606 comes into contact with the film 606, and the region in which the IGBT is formed is entirely enclosed by the n$^+$ heavily doped layers 710 and 609, to reduce IGBT collector resistance. Presence of the n$^+$ heavily doped layer 609 controls fluctuations of potential. It preferably has a thickness not to allow itself to come into contact with a depletion layer evolving when a voltage rating is applied. It is doped with arsenic (As) as an n-type impurity element, which may be replaced by antimony (Sb).

Figure 28:
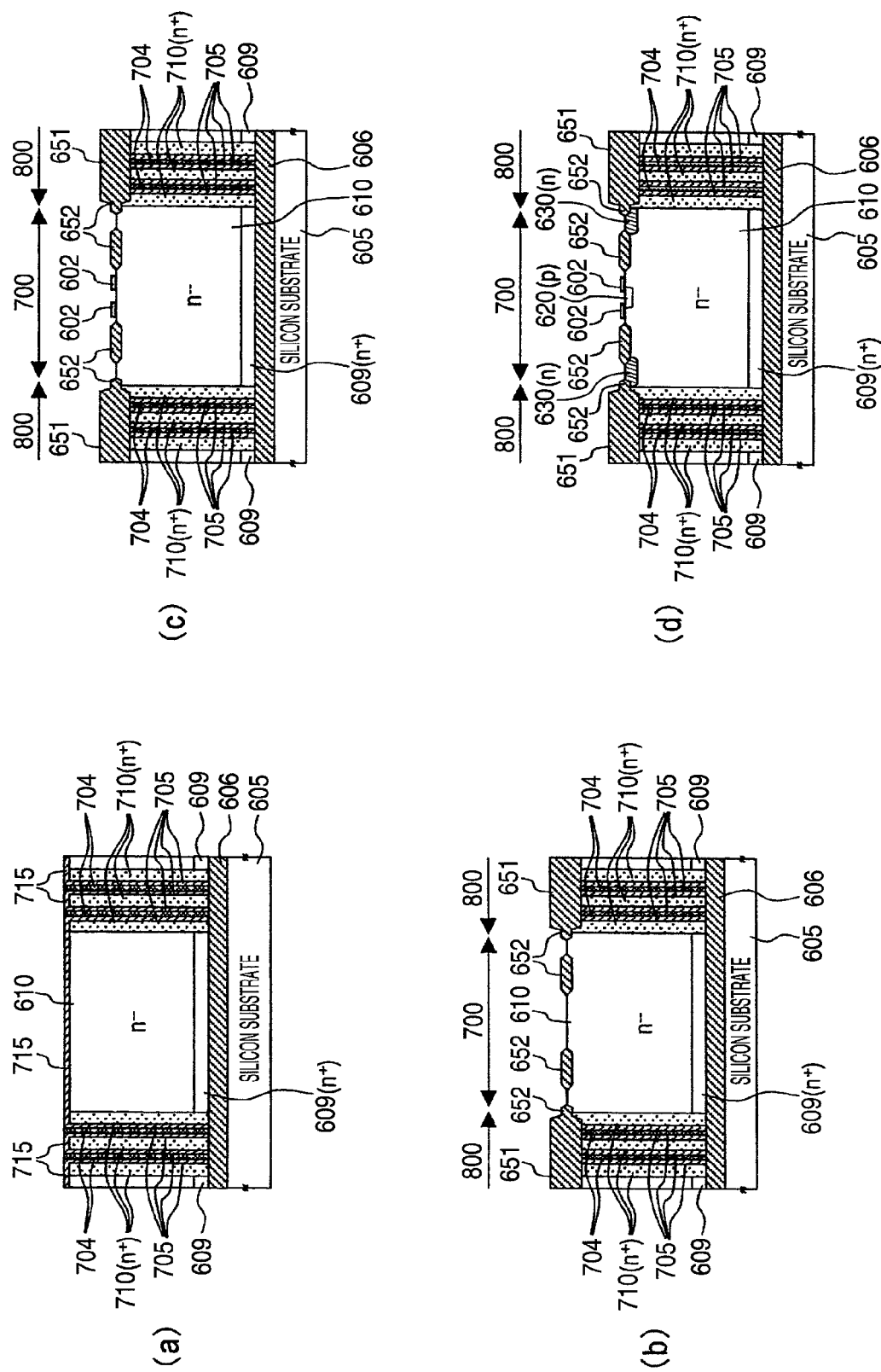
FIG. 28 illustrates the process for fabrication of the semiconductor integrated circuit device of the present invention prepared in Example 9.

FIG. 28 illustrates the process for fabrication of the dielectrically isolated semiconductor device prepared in Example 9.

First, an SOI substrate is prepared, which comprises an active silicon layer on which elements are formed is coated with the n$^{---}$-type active silicon layer 610 and n$^+$ heavily doped layer 609 (FIG. 28 (a)). Then, the same steps as those illustrated in FIGS. 26 (b), (c), (d) and (e) are adopted to form the dielectric substrate on which the IGBT element is formed.

Next, referring to FIG. 28 (b), a selective oxidation step is carried out twice with a silicon nitride film to form the thick oxide film region 651 and thin oxide film region 652. It may be carried out 3 times to form 3 types of oxide films of different thickness.

Referring to FIG. 28 (c), a 50 to 80 nm thick silicon oxide film is formed as a gate electrode on the principal surface of the n$^{---}$-type active silicon layer 610. The gate oxide film is then coated with a polycrystalline silicon film, which is patterned by a common dry etching system to form the gate electrode 602.

Referring to FIG. 28 (d), the p-type channel forming region 620 is formed in a self-aligning manner (i.e., one pattern set determines its positional relation with others) with the gate electrode 602, and the n$^+$ heavily doped region 630 is formed near the element isolating region 800 in such a way to enclose the gate electrode 602.

Subsequently, the n$^+$ heavily doped source layer 601 (refer to FIG. 27) is formed in the p-type channel forming region 620 in a self-aligning manner with the gate electrode 602, and p$^+$ heavily doped collector 603 is formed in the n$^+$ heavily doped region 630, to produce the IGBT element illustrated in FIG. 25.

Example 9 describes a case in which the gate electrode 602 is formed in the central region of the active device region and collector region is formed near the peripheral element isolating region. It is preferable that the gate electrodes, source electrodes and collector regions are arranged in the active device region repeatedly to increase the device capacity.

Example 10

Figure 29:
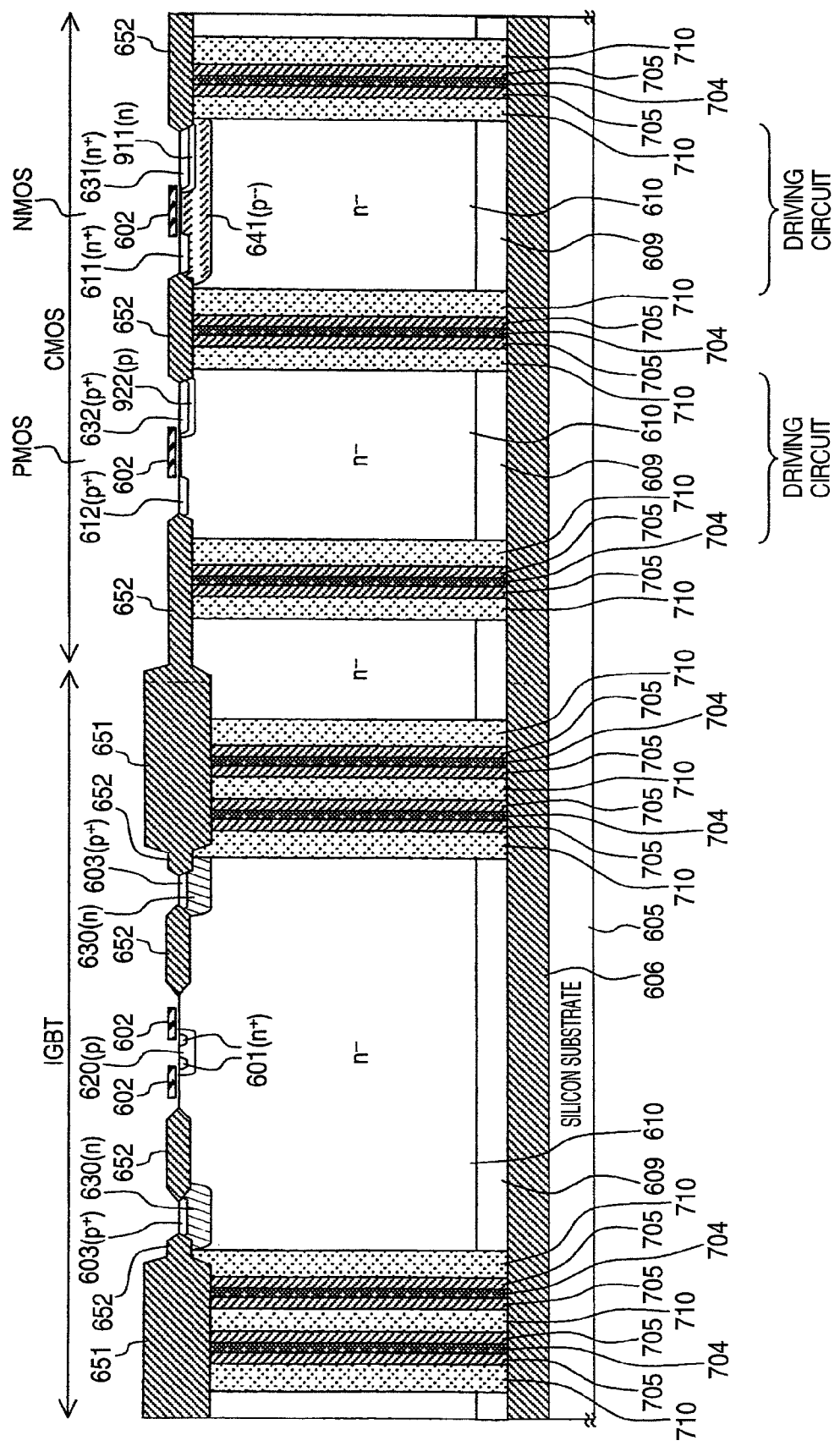
FIG. 29 is a cross-sectional view illustrating the dielectrically isolated semiconductor device of the present invention prepared in Example 10.

FIG. 29 is a cross-sectional view illustrating the dielectrically isolated semiconductor device prepared in Example 10. The device prepared in Example 10 is equipped with a CMOS comprising an IGBT of high breakdown voltage, PMOS transistor of medium breakdown voltage (about 15 V) and NMOS transistor also of medium breakdown voltage. In the PMOS transistor of medium breakdown voltage, the drain region comprises the p-type lightly doped drain region 922 and p$^-$ heavily doped drain region 632, to have a blocking voltage of medium breakdown voltage. The reference numeral 617 represents the p$^+$ heavily doped source. In the NMOS transistor of medium breakdown voltage, the drain region comprises, like that in the PMOS transistor, the n-type lightly doped drain region 911 and n$^+$ heavily doped drain region 631, to have a blocking voltage of medium breakdown voltage. The reference numeral 611 represents the n$^+$ heavily doped source. The NMOS includes the p-type semiconductor region (hereinafter referred to as p-well) 641 which encloses the source 611 and drain 911, to form a pn junction with the n$^{---}$-type active silicon layer 610. In Example 10, the CMOS of medium breakdown voltage has a dielectric isolating region between the NMOS and PMOS, the isolating region comprising the polycrystalline silicon layer 704, oxide layer 705 and n$^+$ heavily doped layer, to form a structure free of parasitic pnpn thyristor structure. This realizes the device of high reliability which completely avoids a latchup phenomenon.

Figure 30:
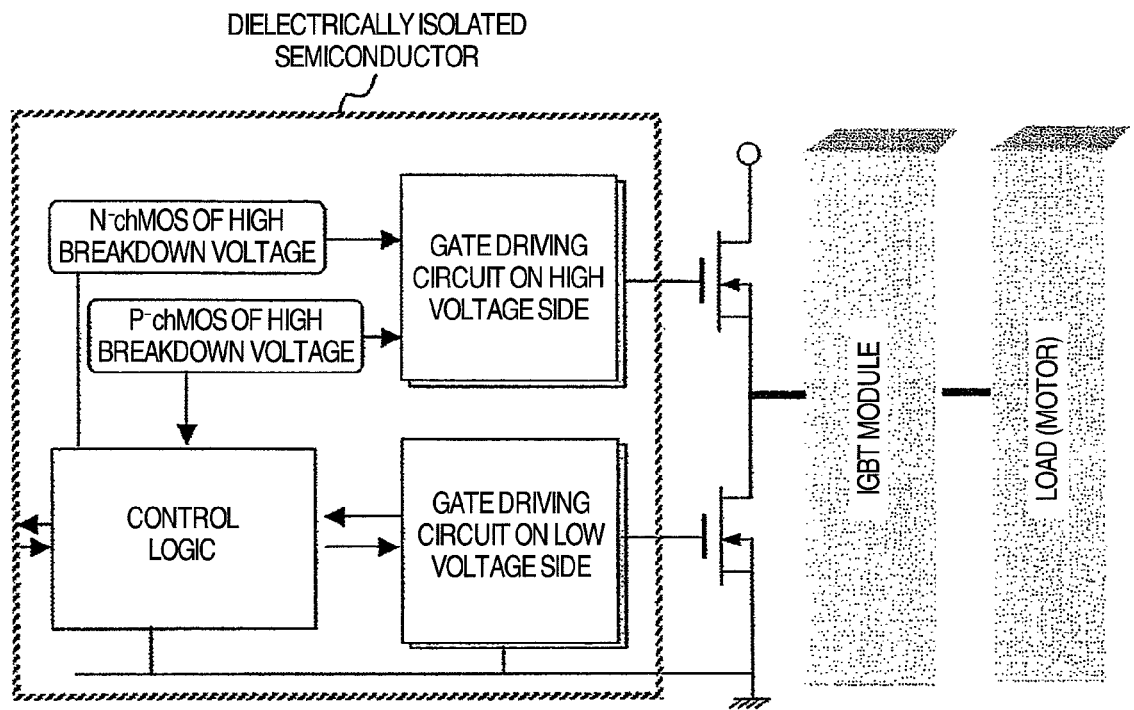
FIG. 30 is a block diagram illustrating a high-capacity motor drive system in which the dielectrically isolated semiconductor device of the present invention is used.

Application Examples (1) FIG. 30 illustrates the dielectrically isolated semiconductor device of the present invention applied to a high-capacity motor drive system. The system comprises an IGBT module for driving the high-capacity motor, upper and lower MOS transistors for controlling switching actions of the IGBT module, and dielectrically isolated semiconductor device for optimally controlling the driving element. The dielectrically isolated semiconductor device of the present invention completely prevents system malfunction even under severe noise atmosphere by switching a large quantity of power flowing in the system.

Figure 19:
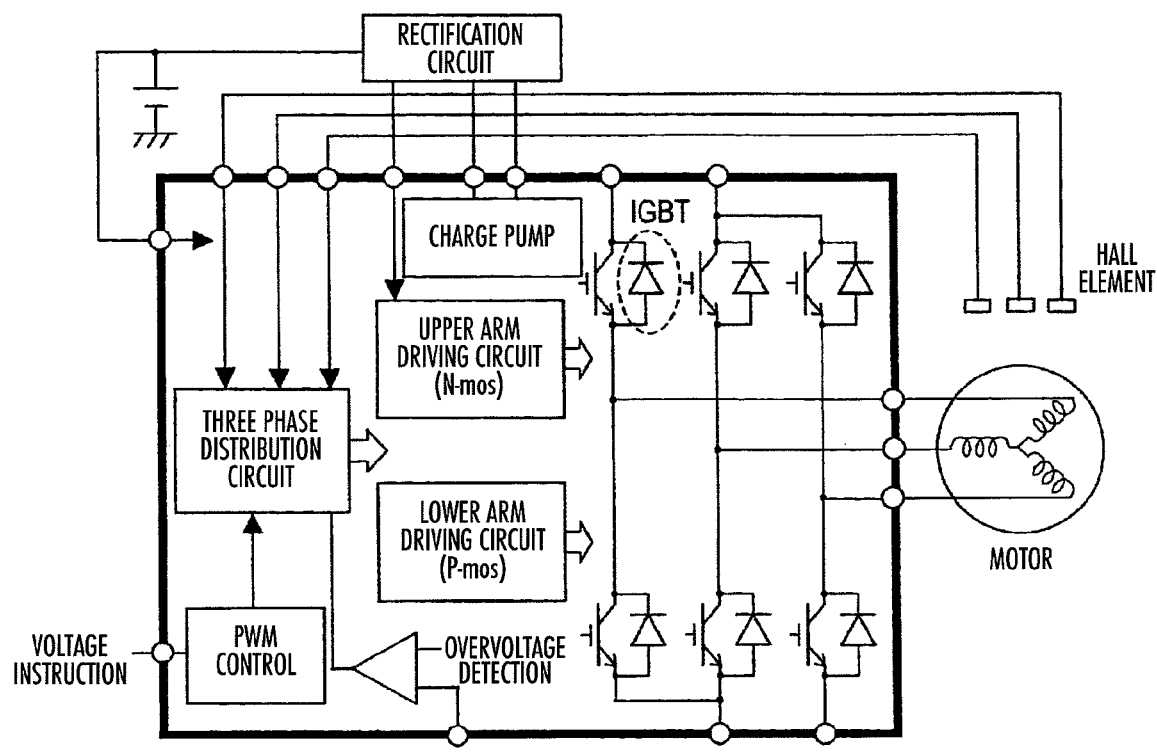
FIG. 19 is a block diagram illustrating a motor drive system in which a one-chip inverter prepared by a conventional technique is used.
Figure 20:
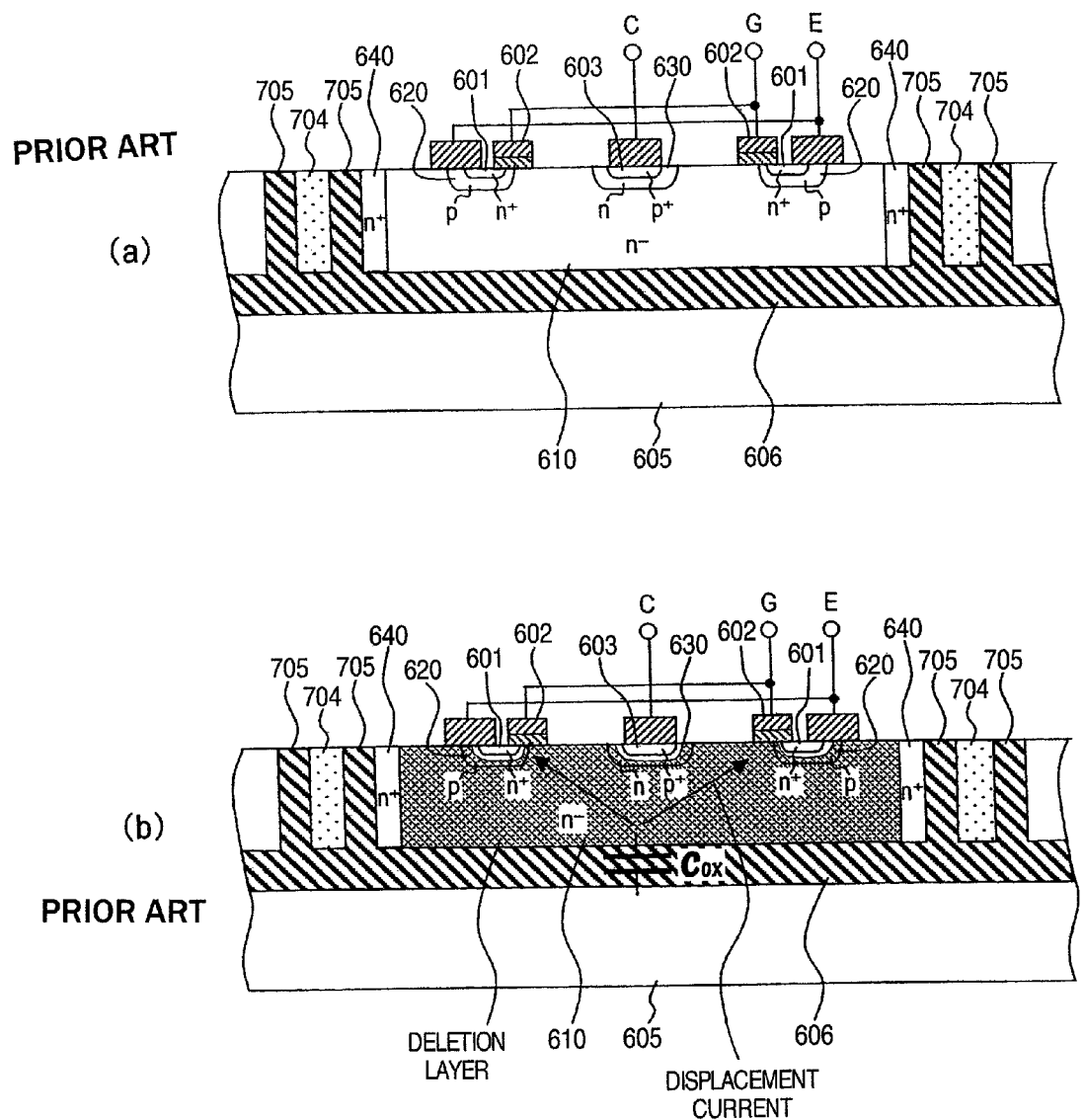
FIG. 20 is a cross-sectional view illustrating a dielectrically isolated semiconductor device prepared by a conventional technique.

The device illustrated in FIG. 30 differs from that illustrated in FIG. 19 in that the IGBT is provided in an IC chip in the latter device but not in the former device, because of the high-capacity motor to which it is connected; the IGBT when provided in an IC chip cannot have a sufficient capacity to supply a large quantity of power to the motor. The dielectrically isolated semiconductor device illustrated in FIG. 19 is referred to as a one-chip inverter IC whereas that illustrated in FIG. 30 to a predriver IC.

As discussed above, the dielectrically isolated semiconductor device of the present invention is applicable to a one-chip inverter IC and predriver IC, the former directly controlling variable motor speed whereas the latter optimally controlling a power device for driving a motor of high capacity.

Figure 31:
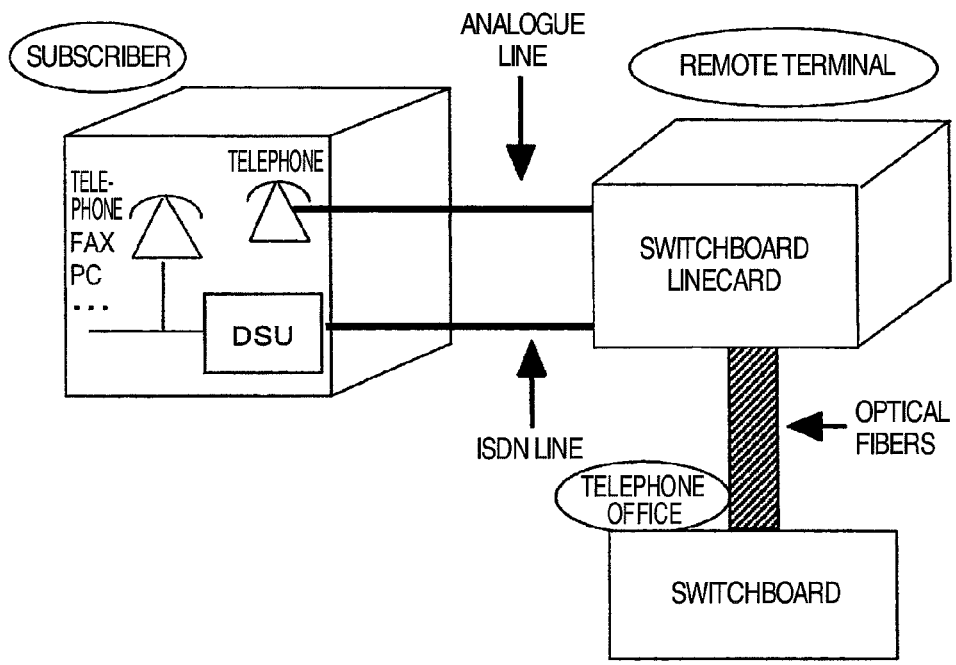
FIG. 31 is a block diagram illustrating a subscribed telephone switchboard circuit system in which the dielectrically isolated semiconductor device of the present invention is used.

(2) FIG. 31 is a block diagram illustrating a communication route from a wired circuit (e.g., telephone circuit) subscriber to a telephone office. At present, both an analogue circuit and digital circuit (ISDN circuit) are used for telephone communication. The telephone switch board linecard in the remote terminal, shown in FIG. 31, receives signals sent from both analogue and digital circuits and transmit them, after converting analogue signals into digital ones, to a telephone switchboard in a telephone office through optical fibers. The IC for a telephone switch board linecard is at present of a two-chip structure with a high breakdown voltage segment chip and low breakdown voltage chip, the former needing a MOS transistor, bipolar transistor or the like having a breakdown voltage of 300 V or more. Use of a semiconductor device incorporated with the highly reliable dielectrically isolated substrate of the present invention can make the communication system compacter and reduce its cost. It can make a device having a breakdown voltage of 300 V or more, and allows the system to work only with one-chip ICs.

Figure 32:
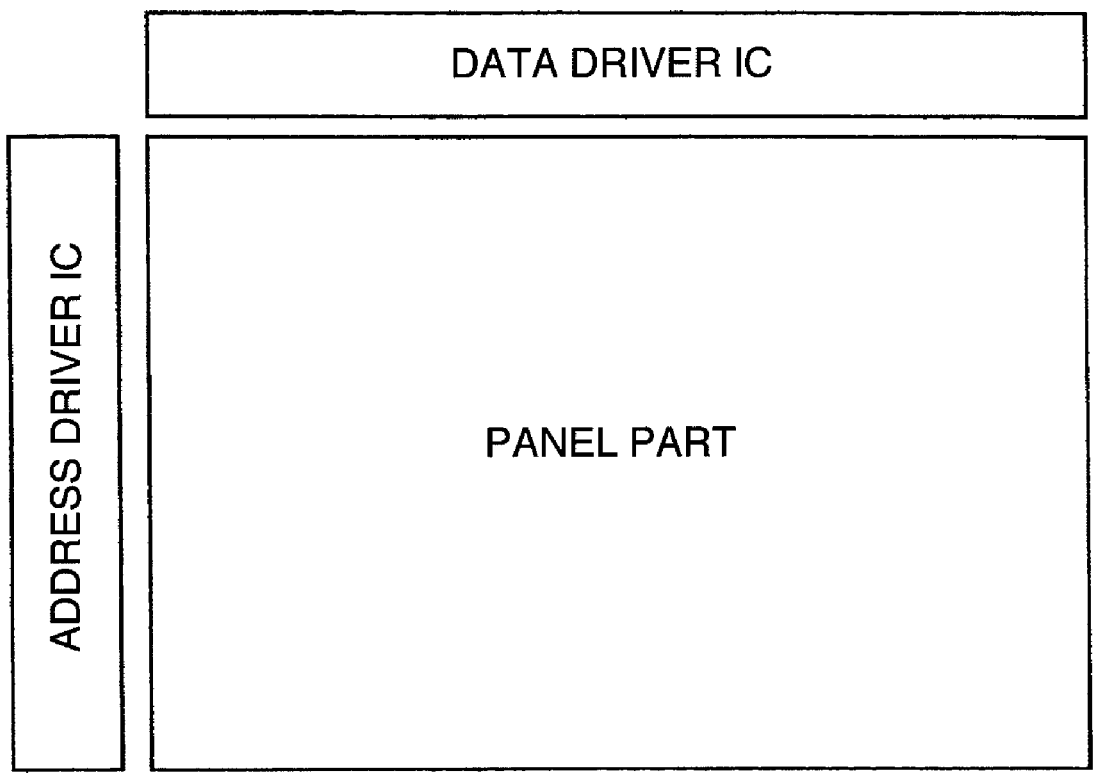
FIG. 32 is a block diagram illustrating a PDF in which the dielectrically isolated semiconductor device of the present invention is used.

(3) FIG. 32 is a block diagram illustrating a plasma display panel (PDP). Driver ICs for lighting the panel are arranged to enclose the panel. The lighting IC is generally categorized as address driver or data driver IC, the former needing a higher breakdown voltage of about 200 V. Increasing IC's breakdown voltage realizes a PDP of improved light-emitting efficiency and reduced loss. When applied to an address driver IC, a semiconductor device incorporated with the highly reliable dielectrically isolated substrate of the present invention can make a device having a breakdown voltage of 200 V or more, realizing an address driver IC of higher breakdown voltage, and a PDP of reduced loss and power consumption.

SUMMARY

The semiconductor device of the present invention, described by each of the embodiments, is provided, on one side, with a first insulation film and lightly doped semiconductor layer, in this order. The lightly doped semiconductor layer has a sufficient thickness to leave a neutral region even when a depletion layer expands at the highest voltage applied to the device. Moreover, the lightly doped semiconductor layer has a region in which a semiconductor element is formed and element isolating region which encloses the former region. In the element isolating region, a deep trench of two-dimensionally closed loop structure is formed to come into contact with the first insulation film. The deep trench is filled with n heavily doped layers on both side walls, second insulation films each adjacent to the n heavily doped layer and polycrystalline semiconductor layer formed between the second insulation films. As described above, these insulation film prepared by thermal oxidation to a uniform thickness on the n heavily doped layers in the deep trench can cover the trench sides, even when the trench is deep. As a result, it has a newly found effect of passivating dislocation in the n heavily doped layers, thus passivating the dislocation induced by a thermal stress. Moreover, gaps in the trench can be filled with the polycrystalline silicon film of high coverage capability to avoid evolution of corona discharge, realizing a narrow and deep element isolating region and hence a dielectrically isolated semiconductor device free of malfunctions by the isolating region of minimum area.

One embodiment of the present invention provides the element isolating region of n-multiple structure, where each active device layer comprises polycrystalline semiconductor layers, second insulation layers adjacent to each side of the polycrystalline semiconductor layer, and $n^+$ heavily doped layers adjacent to each side of the second insulation layer. These adjacent layers are the n-multiple polycrystalline semiconductor layers, 2n-multiple oxide layers and (n+1)-multiple $n^+$ heavily doped layers, to provide a dielectrically isolated structure. In this multiple element isolating structure, the oxide film invariably comes into contact with the $n^+$ heavily doped layer on the side to prevent expansion of the dislocation, driven by an oxidation-induced stress. Moreover, the multiple element isolating structure provides the semiconductor device of greatly reduced percent defective with respect to element isolating breakdown voltage. Still more, the layers between the trenches are totally of the $n^+$ heavily doped layers to control expansion of the element areas.

The dielectrically isolated semiconductor device of the embodiment has a heavily doped layer between the first insulating film and lightly doped semiconductor layer, the additional layer further reducing potential variations.

The process for fabrication of the semiconductor device, described in the embodiments, comprises steps for preparing an SOI substrate with a first silicon oxide film and silicon layer supported by a silicon-supporting substrate; for forming a trench running almost vertically from the principal surface of the silicon layer to the silicon oxide layer; for heavily doping the trench sides with an n-type impurity element; for filling the trench with an oxide film and polycrystalline silicon, the former being formed by thermal oxidation; and for forming oxide films to isolate active element layers from each other, these oxide films being formed by selective field oxidation to have different thickness. The silicon layer is deeper than an expanded distance of a depletion layer subjected to the highest voltage applied to the device to leave a neutral region therein. The process provides the dielectrically isolated semiconductor device of high reliability by realizing the fine and deep element isolating region which can prevent dislocation of the oxide film as an insulation layer by oxidation-induced stress.

The process forms a plurality of trenches, each being heavily doped with an n-type impurity element on both sides and filled with the oxide film prepared by thermal oxidation and polycrystalline silicon. The resulting device of multiple isolation structure can have a greatly reduced percent defective with respect to element isolating breakdown voltage.

The present invention describes specifically by the embodiments, which by no means limit the present invention. It is needless to say that variations and modifications can be made within the scope of the present invention.

The embodiments describe only representative elements, e.g., IGBT and/or CMOS. However, the dielectrically isolated structure described in the embodiments can include one or more other elements, e.g., resistor, diode, bipolar element, NMOS of high breakdown voltage, PMOS of high breakdown voltage and so forth.

It should be further understood by those skilled in the art that although the foregoing description has been made on embodiments of the invention, the invention is not limited thereto and various changes and modifications may be made without departing from the spirit of the invention and the scope of the appended claims.

ADVANTAGES OF THE INVENTION

The semiconductor integrated circuit device of the present invention allows a voltage to be uniformly applied to side insulation films formed in the trench at both sides to improve dielectric strength voltage of the device, and therefore can provide an integrated circuit device of high reliability and high dielectric strength voltage.

Moreover, the present invention can prevent dislocation of an oxide film as an insulation layer by oxidation-induced stress, realize a fine and deep element isolating region, and therefore provide a dielectrically isolated semiconductor device of high reliability.

The invention claimed is:

1. A dielectrically isolated semiconductor device comprising:
    a semiconductor substrate;
    a first insulation film formed on one side of the semiconductor substrate; and
    a first doped semiconductor layer formed on the first insulation film; wherein:
    the first doped semiconductor layer is deeper than an expanded distance of a depletion layer subjected to the highest voltage applied to the device,
    the first doped semiconductor layer includes an active device region in which an element is formed and an element isolating region which encloses the active device region,
    the element isolating region is provided with a plurality of trenches coming into contact with the first insulation film and structured to form a two-dimensional closed loop, and
    each of the trenches is filled with second doped layers, doped with n-type impurities and doped more heavily than the first doped semiconductor layer, and second insulation films each adjacent to one of the second doped layers,
    wherein the element isolating layer has an n-multiple structure including the plurality of trenches, and further comprising polycrystalline semiconductor layers, the second insulation layers adjacent to each side of the polycrystalline semiconductor layer, and the second doped layers, respectively, adjacent to each side of the second insulation layers, said adjacent layers comprising n-multiple polycrystalline silicon layers, 2n-multiple second insulation layers and (n+1)-multiple second doped layers.

2. The dielectrically isolated semiconductor device according to claim 1, wherein a third doped layer, more heavily doped than the first doped semiconductor layer, is formed between the first insulation film and the first doped semiconductor layer.

3. The dielectrically isolated semiconductor device according to claim 1, wherein each of the first and second insulation films is comprised of a silicon oxide film formed by a thermal oxidation.

4. The dielectrically isolated semiconductor device according to claim 1, wherein the second doped layers, and second insulation layers and polycrystalline semiconductor layers, are formed in a self-aligning manner with the trench coming into contact with the first insulation layer.

5. A predriver IC which includes the dielectrically isolated semiconductor device according to claim 1.

6. A one-chip inverter which includes the dielectrically isolated semiconductor device according to claim 1.

7. The dielectrically isolated semiconductor device according to claim 1, wherein the second doped layers are doped with $n^+$ impurity.

8. The dielectrically isolated semiconductor device according to claim 1,
    wherein the second insulation layers are comprised of an oxide.

9. The dielectrically isolated semiconductor device according to claim 7,
    wherein the second insulation layers are comprised of an oxide.

* * * * *